United States Patent
Jung et al.

(10) Patent No.: US 12,309,948 B2
(45) Date of Patent: May 20, 2025

(54) ROLLABLE ELECTRONIC DEVICE INCLUDING GEAR ASSEMBLY

(71) Applicant: SAMSUNG ELECTRONICS CO., LTD., Suwon-si (KR)

(72) Inventors: Hojin Jung, Suwon-si (KR); Moonsun Kim, Suwon-si (KR); Hyoungtak Cho, Suwon-si (KR); Yangwook Kim, Suwon-si (KR); Changryong Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 223 days.

(21) Appl. No.: 18/056,011

(22) Filed: Nov. 16, 2022

(65) Prior Publication Data

US 2023/0199984 A1    Jun. 22, 2023

Related U.S. Application Data

(63) Continuation of application No. PCT/KR2022/015301, filed on Oct. 11, 2022.

(30) Foreign Application Priority Data

Dec. 20, 2021 (KR) .......... 10-2021-0182450
Jan. 25, 2022 (KR) .......... 10-2022-0010519

(51) Int. Cl.
    *H05K 5/02*    (2006.01)
    *H04M 1/02*    (2006.01)

(52) U.S. Cl.
    CPC ........ *H05K 5/0217* (2013.01); *H04M 1/0237* (2013.01); *H04M 1/0268* (2013.01)

(58) Field of Classification Search
    CPC .......... H05K 5/0217; H04M 1/0237; H04M 1/0268; G06F 1/16; G09F 9/30
    See application file for complete search history.

(56) References Cited

U.S. PATENT DOCUMENTS 10,747,269 B1 * 8/2020 Choi .............. G06F 1/1652
10,976,775 B1   4/2021 Cha
(Continued)

FOREIGN PATENT DOCUMENTS

CN    113098995       7/2021
CN    113676568 A  * 11/2021 .......... H04M 1/0235
(Continued)

OTHER PUBLICATIONS

International Search Report dated Jan. 25, 2023 for PCT/KR2022/015301.
(Continued)

*Primary Examiner* — Rockshana D Chowdhury
*Assistant Examiner* — Martin Antonio Asmat Uceda
(74) *Attorney, Agent, or Firm* — Nixon & Vanderhye P.C.

(57) ABSTRACT

An electronic device may include a housing including a first housing and a second housing configured to receive at least a portion of the first housing and move relative to the first housing, a display configured to be rolled or unrolled based on a slide of the housing, a display supporting member supporting at least a portion of the display, a motor structure including a motor core configured to generate a driving force for the slide of the housing and disposed in the housing, a first gear assembly connected to the first housing and a first end of the motor structure and configured to transfer at least a portion of the driving force generated by the motor core to the first housing, and a second gear assembly connected to the display supporting member and a second end of the motor structure, which is opposite to the first end, and configured to transfer at least a portion of the driving force to the display supporting member.

19 Claims, 17 Drawing Sheets

(56) References Cited

U.S. PATENT DOCUMENTS

| | | | |
|---|---|---|---|
| 11,283,910 B2* | 3/2022 | Lee | G06F 1/1652 |
| 11,494,064 B2* | 11/2022 | Kang | H04M 1/0241 |
| 11,514,823 B2* | 11/2022 | Shin | G06F 1/1624 |
| 11,563,835 B2* | 1/2023 | Lim | G06F 1/1624 |
| 11,647,597 B2* | 5/2023 | Liu | G06F 1/1652 |
| | | | 361/807 |
| 11,800,661 B2* | 10/2023 | Liu | H04M 1/0237 |
| 11,805,605 B2 | 10/2023 | Yoon et al. | |
| 11,910,549 B2* | 2/2024 | Ko | G09F 9/301 |
| 2022/0166861 A1 | 5/2022 | Lim et al. | |
| 2022/0238047 A1 | 7/2022 | Shin | |

FOREIGN PATENT DOCUMENTS

| | | | | |
|---|---|---|---|---|
| JP | 2011-034346 A | 2/2011 | | |
| KR | 10-2011-0082943 | 7/2011 | | |
| KR | 10-2011-0082943 A | 7/2011 | | |
| KR | 10-2016-0081786 | 7/2016 | | |
| KR | 10-2021-0068272 | 6/2021 | | |
| KR | 20210068272 A * | 6/2021 | | G06F 1/1613 |
| KR | 10-2274481 B1 | 7/2021 | | |
| KR | 10-2021-0148396 A | 12/2021 | | |
| WO | 2020/256183 | 12/2020 | | |
| WO | WO 2021/107619 A1 | 6/2021 | | |
| WO | WO 2021/125391 A1 | 6/2021 | | |

OTHER PUBLICATIONS

PCT Written Opinion dated Jan. 25, 2023 for PCT/KR2022/015301.
Extended European Search Report dated Nov. 28, 2024 for EP Application No. 22911544.9.

* cited by examiner

ROLLABLE ELECTRONIC DEVICE INCLUDING GEAR ASSEMBLY

CROSS-REFERENCE TO RELATED APPLICATIONS

This application is a continuation of International Application No. PCT/KR2022/015301 designating the United States, filed on Oct. 11, 2022, in the Korean Intellectual Property Receiving Office and claiming priority to Korean Patent Application No. 10-2021-0182450, filed on Dec. 20, 2021, in the Korean Intellectual Property Office, and to Korean Patent Application No. 10-2022-0010519, filed on Jan. 25, 2022, in the Korean Intellectual Property Office, the disclosures of which are all hereby incorporated by reference herein in their entireties.

BACKGROUND

Field

An embodiment of the disclosure relates to a rollable electronic device including a gear assembly.

Background

With the development of information and communication technology and semiconductor technology, various functions are being integrated into one portable electronic device. For example, an electronic device may implement not only communication functions but also entertainment functions, such as playing games, multimedia functions, such as playing music and videos, communication and security functions for mobile banking, and scheduling and e-wallet functions. Such electronic devices become compact enough for users to carry in a convenient way.

As mobile communication services extend up to multimedia service sectors, electronic devices require a larger display to allow users satisfactory use of multimedia services as well as voice call or text messaging services. This, however, trades off the trend of electronic devices being compact.

SUMMARY

Technical Solution

According to an embodiment of the disclosure, an electronic device may comprise a housing including a first housing and a second housing configured to receive at least a portion of the first housing and move relative to the first housing, a display configured to be rolled or unrolled based on a slide movement of the housing, a display support member supporting at least a portion of the display, a motor structure including a motor core configured to generate a driving force for the slide movement of the housing and disposed in the housing, a first gear assembly connected (directly or indirectly) to the first housing and a first end of the motor structure and configured to transfer at least a portion of the driving force generated by the motor core to the first housing, and a second gear assembly connected (directly or indirectly) to the display support member and a second end of the motor structure, which is opposite to the first end, and configured to transfer at least a portion of the driving force to the display support member.

According to an embodiments of the disclosure, an electronic device may comprise a housing including a first housing and a second housing configured to receive at least a portion of the first housing and move relative to the first housing, a display configured to be rolled or unrolled based on a slide movement of the housing, a display support member supporting at least a portion of the display, a motor structure including a motor core configured to generate a driving force for the slide movement of the housing, a motor shaft connected (directly or indirectly) to the motor core, a first speed change gear connected (directly or indirectly) to a first shaft end of the motor shaft, and a second speed change gear connected (directly or indirectly) to a second shaft end of the motor shaft, opposite to the first shaft end, a first gear assembly having at least a portion connected (directly or indirectly) to the second housing and configured to transfer at least a portion of the driving force transferred from the first speed change gear to the first housing, and a second gear assembly having at least a portion connected (directly or indirectly) to the display support member and configured to transfer at least a portion of the driving force transferred from the second speed change gear to the display support member.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
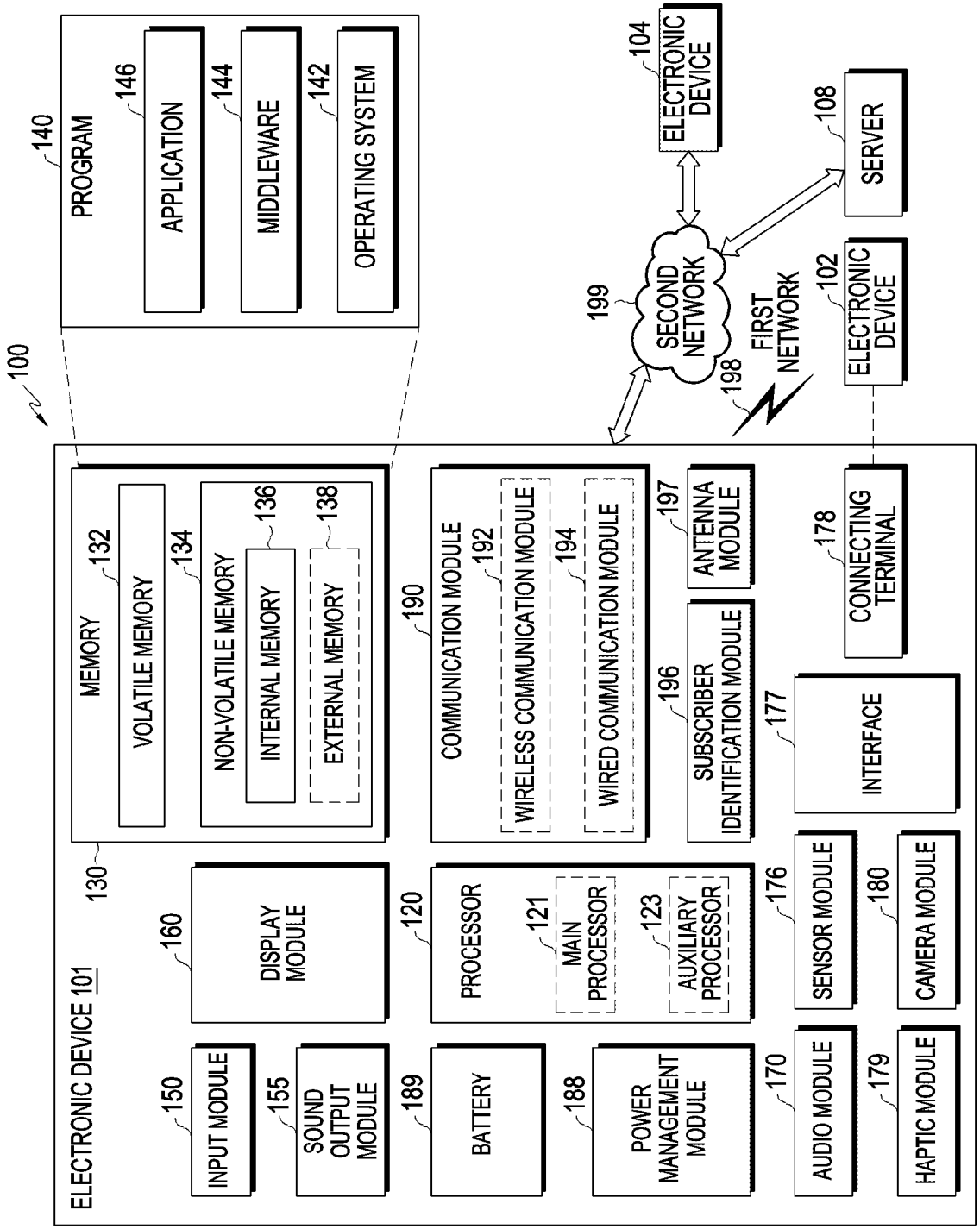
FIG. 1 is a block diagram illustrating an electronic device in a network environment according to an embodiment of the disclosure.

FIG. 1 is a block diagram illustrating an electronic device in a network environment according to various embodiments;

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via at least a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
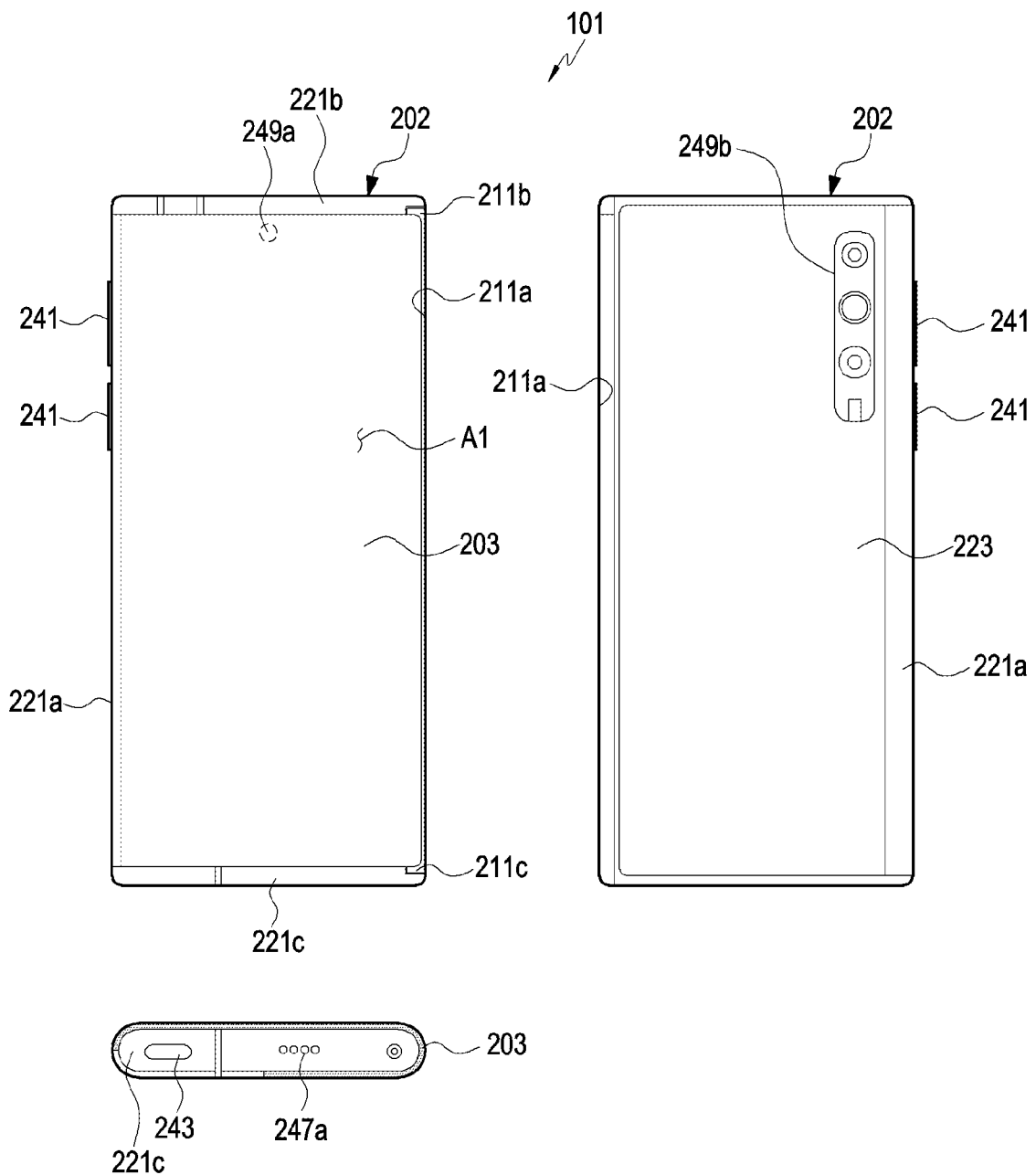
FIG. 2 is a view illustrating an electronic device in a closed state, according to an embodiment of the disclosure.
Figure 3:
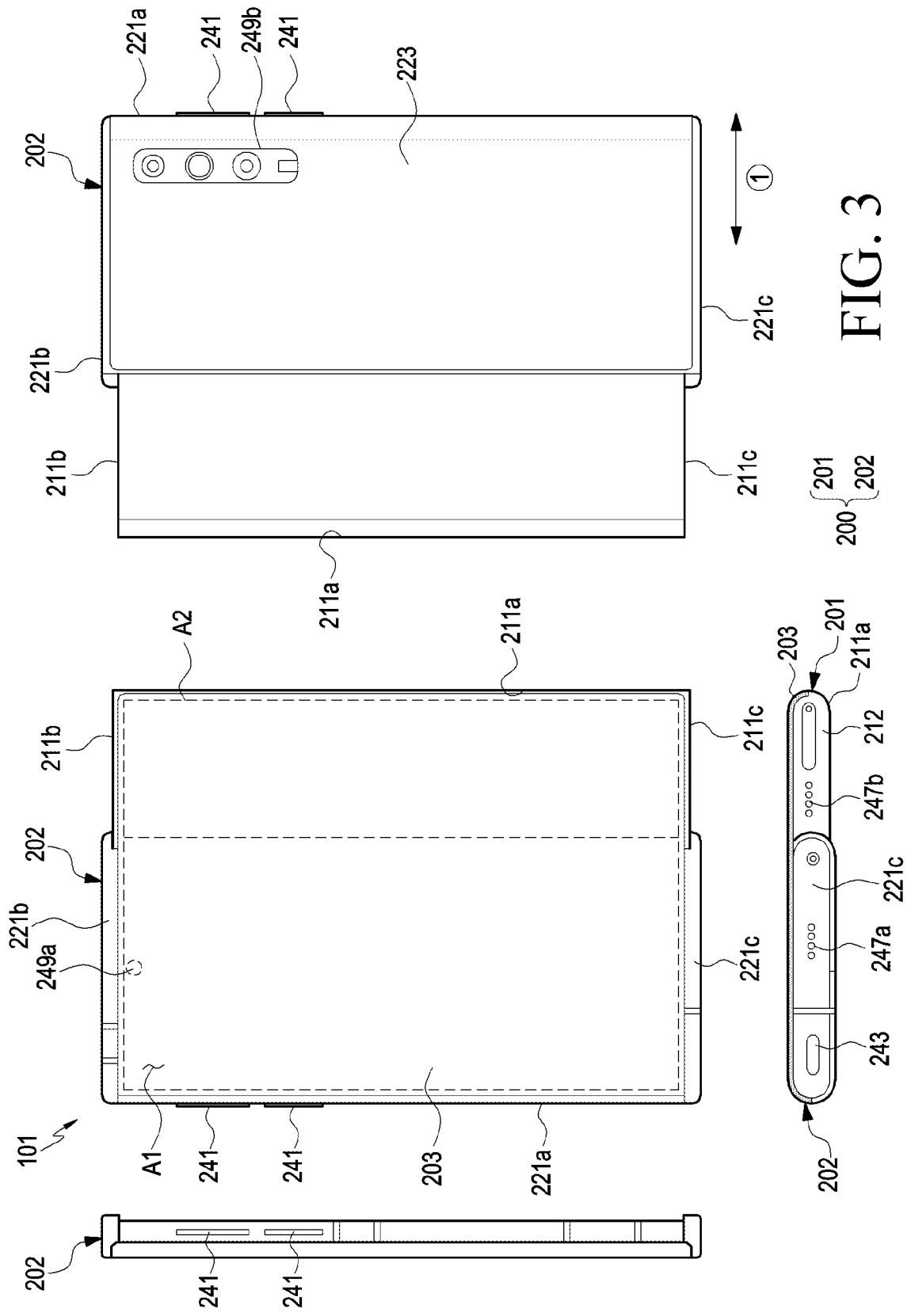
FIG. 3 is a view illustrating an electronic device in an opened state, according to an embodiment of the disclosure.

FIG. 2 is a view illustrating an electronic device in a closed state, according to various embodiments. FIG. 3 is a view illustrating an electronic device in an opened state, according to various embodiments; For example, FIG. 2 is a view illustrating a state in which a second display area A2 is received in a housing 200. FIG. 3 is a view illustrating a state in which at least a portion of the second display area A2 is visually exposed to the outside of the housing 200.

The state shown in FIG. 2 may be denoted as a first housing 201 (e.g., see FIG. 3) being closed with respect to a second housing 202, and the state shown in FIG. 2 may be denoted as the first housing 201 being open with respect to the second housing 202. According to an embodiment, the "closed state" or "opened state" may be defined as a closed or opened state of the electronic device.

Referring to FIGS. 2 and 3, the electronic device 101 may include a housing 200. The housing 200 may include a second housing 202 and a first housing 201 that is movable with respect to the second housing 202. According to an embodiment, the electronic device 101 may be interpreted as having a structure in which the second housing 202 is disposed to be slidable with respect to the first housing 201. According to an embodiment, the first housing 201 may be disposed to perform reciprocating motion by a predetermined distance in a predetermined direction with respect to the second housing 202, for example, a direction indicated by an arrow ①. The configuration of the electronic device 101 of FIGS. 2 and 3 may be identical in whole or part to the configuration of the electronic device 101 of FIG. 1.

According to an embodiment, the first housing 201 may be referred to as, e.g., a first structure, a slide part, or a slide housing, and may be disposed to reciprocate on the second housing 202. According to an embodiment, the second housing 202 may be referred to as, e.g., a second structure, a main part, or a main housing. The second housing 202 may receive at least a portion of the first housing 201 and may guide the slide of the first housing 201. According to an embodiment, the second housing 202 may receive various electrical and electronic components, such as a main circuit board or a battery. According to an embodiment, at least a portion (e.g., the first display area A1) of the display 203 may be visually exposed to the outside of the housing 200. According to an embodiment, another portion (e.g., the second display area A2) of the display 203 may be received into the inside of the second housing 202 (e.g., a slide-in motion) or be visually exposed to the outside of the second housing 202 (e.g., a slide-out motion) as the first housing 201 moves (e.g., slides) with respect to the second housing 202. According to an embodiment, a motor, a speaker, a sim socket, and/or a sub circuit board electrically connected with a main circuit board may be disposed in the first housing 201. A main circuit board on which electrical components, such as an application processor (AP) and a communication processor (CP) are mounted may be disposed in the second housing 202.

Figure 4:
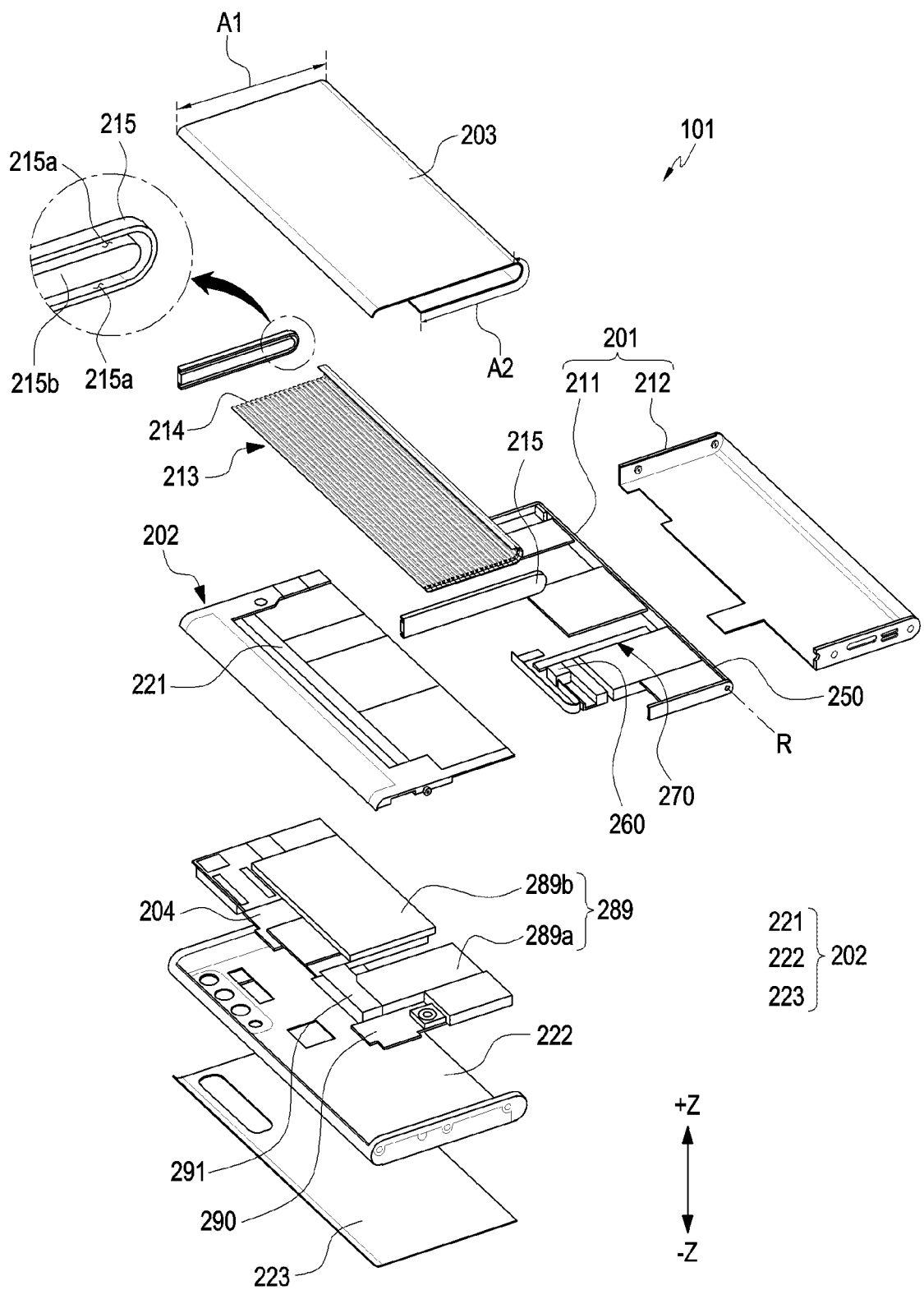
FIG. 4 is an exploded perspective view illustrating an electronic device according to an embodiment of the disclosure.

According to an embodiment, the first housing 201 may include first sidewalls 211a, 211b, and 211c for surrounding at least a portion of the display 203 and/or the display support member (e.g., the display support member 213 of FIG. 4). According to an embodiment, the first sidewalls 211a, 211b, and 211c may extend from the first plate (e.g., the first plate 211 of FIG. 4). The first sidewalls 211a, 211b, and 211c may include a 1-2th sidewall 211b, a 1-3th sidewall 211c opposite to the 1-2th sidewall 211b, and a 1-1th sidewall 211a extending from the 1-2th sidewall 211b to the 1-3th sidewall 211c. The 1-1th sidewall 211a may be substantially perpendicular to the 1-2th sidewall 211b and/or the 1-3th sidewall 211c. According to an embodiment, in the closed state (e.g., FIG. 2) of the electronic device 101, the 1-2th sidewall 211b may face the 2-2th sidewall 221b of the second housing 202, and the 1-3th sidewall 211c may face the 2-3th sidewall 221c of the second housing 202. According to an embodiment, the 1-1th sidewall 211a, the 1-2th sidewall 211b, and/or the 1-3th sidewall 211c may be integrally formed with a first plate (e.g., the first plate 211 or slide cover 212 of FIG. 4). According to another embodiment, the 1-1th sidewall 211a, the 1-2th sidewall 211b, and/or the 1-3th sidewall 211c may be formed as separate housings and be combined or assembled.

According to an embodiment, the second housing 202 may include second sidewalls 221a, 221b, and 221c to surround at least a portion of the first housing 201. According to an embodiment, the second sidewalls 221a, 221b, and 221c may extend from a second plate (e.g., the second plate 221 of FIG. 4) and/or a cover member (e.g., the cover member 222 of FIG. 4). According to an embodiment, the second sidewalls 221a, 221b, and 221c may include a 2-2th sidewall 221b, a 2-3th sidewall 221c opposite to the 2-2th sidewall 221b, and a 2-1th sidewall 221a extending from the 2-2th sidewall 221b to the 2-3th sidewall 221c. According to an embodiment, the 2-1th sidewall 221a may be substantially perpendicular to the 2-2th sidewall 221b and/or the 2-3th sidewall 221c. According to an embodiment, the 2-2th sidewall 221b may face the 1-2th sidewall 211b, and the 2-3th sidewall 221c may face the 1-3th sidewall 211c. For example, in the closed state (e.g., FIG. 2) of the electronic device 101, the 2-2th sidewall 221b may cover at least a portion of the 1-2th sidewall 211b, and the 2-3th sidewall 221c may cover at least a portion of the 1-3th sidewall 211c.

According to various embodiments, the second housing 202 may be formed to be open at one side (e.g., a front face) to receive (or surround) at least a portion of the first housing 201. For example, the first housing 201 may be connected (directly or indirectly) to the second housing 202 while being at least partially surrounded by the 2-1th sidewall 221a, the 2-2th sidewall 221b, and the 2-3th sidewall 221c and may be slid in the direction of arrow ① while being guided by the second housing 202. According to an embodiment, the cover member (e.g., the cover member 222 of FIG. 4), the 2-1th sidewall 221a, the 2-2th sidewall 221b, and/or the 2-3th sidewall 221c may be formed integrally. According to another embodiment, the second cover member 222, the 2-1th sidewall 221a, the 2-2th sidewall 221b, and/or the 2-3th sidewall 221c may be formed as separate housings and be combined or assembled.

According to an embodiment, the second housing 202 may include a rear plate 223. According to an embodiment, the rear plate 223 may form at least a portion of the exterior of the electronic device 101. For example, the rear plate 223 may provide a decorative effect on the exterior of the electronic device 101.

According to an embodiment, the cover member 222 and/or the 2-1th sidewall 221a may cover at least a portion of the display 203. For example, at least a portion of the display 203 (e.g., the second display area A2) may be received in the second housing 202, and the cover member 222 and/or the 2-1th side wall 221a may cover a portion of the display 203 received in the second housing 202.

According to an embodiment, the electronic device 101 may include a display 203. For example, the display 203 may be interpreted as a flexible display or a rollable display. According to an embodiment, at least a portion of the display 203 (e.g., the second display area A2) may slide based on the sliding movement of the first housing 201. According to an embodiment, the display 203 may include, or be disposed adjacent to, a touch detection circuit, a pressure sensor capable of measuring the intensity (pressure) of a touch, and/or a digitizer that detects a magnetic field-type stylus pen. The configuration of the display 203 of FIGS. 2 and 3 may be identical in whole or part to the configuration of the display module 160 (comprising a display) of FIG. 1.

According to an embodiment, the display 203 may include a first display area A1 and a second display area A2. According to an embodiment, the first display area A1 may be an area that is always visible from the outside. According to an embodiment, the first display area A1 may be interpreted as an area that cannot be positioned inside the housing 202. According to an embodiment, the first display area A1 may be seated on a portion (e.g., the first plate 211) of the first housing 201. According to an embodiment, the second display area A2 may extend from the first display area A1, and the second display area A2 may be inserted or received in, or visually exposed to the outside of, the second housing 202 as the first housing 201 slides.

According to an embodiment, the second display area A2 may be substantially moved while being guided by the multi-bar structure (e.g., the supporting structure 213 of FIG. 4) mounted in the first housing 201 and may be thus received in, or visually exposed to the outside of, the second housing 202 or a space formed between the first housing 201 and the second housing 202. According to an embodiment, the second display area A2 may be moved based on the sliding movement of the first housing 201 in the width direction (e.g., the direction indicated by the arrow ①). For example, at least a portion of the second display area A2 may be unfolded or rolled together with the display support member 213 based on a slide of the first housing 201.

According to an embodiment, when viewed from above the first housing 201, if the first housing 201 moves from the closed state to the opened state, the second display area A2 may be gradually exposed to the outside of the housing 202 to be substantially coplanar with the first display area A1. In an embodiment, the second display area A2 may be at least partially received in the first housing 201 and/or the second housing 202.

According to an embodiment, the electronic device 101 may include at least one key input device 241, a connector hole 243, audio modules 247a and 247b, or camera modules 249a and 249b. Although not shown, the electronic device 101 may further include an indicator (e.g., a light emitting diode (LED) device) or various sensor modules. The configuration of the audio module 247a and 247b and camera modules 249a and 249b of FIGS. 2 and 3 may be identical in whole or part to the configuration of the audio module 170 and the camera module 180 of FIG. 1. Each "module" herein may comprise circuitry.

According to an embodiment, the key input device 241 may be positioned in one area of the second housing 202. Depending on the appearance and the state of use, the electronic device 101 may be designed to omit the illustrated key input device 241 or to include additional key input device(s). According to an embodiment, the electronic device 101 may include a key input device (not shown), e.g., a home key button or a touchpad disposed around the home key button. According to another embodiment (not shown), at least a portion of the key input device 241 may be disposed on the second housing 202.

According to an embodiment, the key input device 241 may be used as a driving structure for automatically or semi-automatically providing a slide in-out motion of the display 203. For example, when the user presses an open trigger button (e.g., the key input device 241 of FIG. 2) exposed outside the electronic device 101, the display 203 may automatically slide in or out (automatic operation). As another example, when the user slides out the display 203 by pushing the display 203 of the electronic device 101 up to a designated section, for the remaining section, it may be completely slid out by the force of an elastic member (not shown) and/or a driving body (not shown) mounted in the electronic device 101 (semi-automatic operation). For example, the electronic device 101 may slide out in the closed state (e.g., FIG. 2) and switch to the opened state (e.g., FIG. 3). The slide-in motion of the electronic device 101 may also be performed to correspond to the slide-out motion.

According to an embodiment, the connector hole 243 may be omitted or may receive a connector (e.g., a universal serial bus (USB) connector) for transmitting and receiving power and/or data with an external electronic device. Although not shown, the electronic device 101 may include a plurality of connector holes 243, and some of the plurality of connector holes 243 may function as connector holes for transmitting/receiving audio signals with an external electronic device. In the illustrated embodiment, the connector hole 243 is disposed in the 2-3th sidewall 221c, but the scope is not limited thereto. The connector hole 243 or a connector hole not shown may be disposed in the 2-1th sidewall 221a or the 2-2th sidewall 221b.

According to an embodiment, the audio modules 247a and 247b may include at least one speaker hole and/or at least one microphone hole. At least one of the speaker holes may be provided as an external speaker hole. At least one of the speaker holes may be provided as a receiver hole for voice call. The electronic device 101 may include a microphone for obtaining sound. The microphone may obtain external sound of the electronic device 101 through the microphone hole. According to an embodiment, the electronic device 101 may include a plurality of microphones to detect the direction of sound. According to an embodiment, the electronic device 101 may include an audio module in which the speaker holes and/or the microphone hole are implemented as one hole or may include a speaker without the speaker hole (e.g., a piezo speaker).

According to an embodiment, the camera modules 249a and 249b may include a first camera module 249a and/or a second camera module 249b. The second camera module 249b may be positioned in the second housing 202 and may capture a subject in a direction opposite to the first display area A1 of the display 203. The electronic device 101 may include a plurality of camera modules 249a and 249b. For example, the electronic device 101 may include at least one of a wide-angle camera, a telephoto camera, or a close-up camera. According to an embodiment, the electronic device 101 may measure the distance to the subject by including an infrared projector and/or an infrared receiver. The camera modules 249a and 249b may include one or more lenses, an image sensor, and/or an image signal processor. The electronic device 101 may further include another camera module (e.g., the front camera) (e.g., the first camera module 249a) that captures a subject in a direction opposite to the second camera module 249b. For example, the first camera module 249a may be disposed around the first display area A1 or in an area overlapping the first display area A1. If disposed in an area overlapping the display 203, the first camera module 249a may capture the subject through the display 203.

According to an embodiment, an indicator (e.g., an LED device) of the electronic device 101 may be disposed on the first housing 201 and/or the second housing 202, and the indicator may include a light emitting diode to provide state information about the electronic device 101 as a visual signal. The sensor module (e.g., the sensor module 176 of FIG. 1) of the electronic device 101 may produce an electrical signal or data value corresponding to the internal operation state or external environment state of the electronic device. The sensor module (comprising at least one sensor) may include, for example, a proximity sensor, a fingerprint sensor, or a biometric sensor (e.g., an iris/face recognition sensor or a heartrate monitor (HRM) sensor). In another embodiment, the electronic device 101 may include at least one of a gesture sensor, a gyro sensor, an atmospheric pressure sensor, a magnetic sensor, an accelerometer, a grip sensor, a color sensor, an infrared (IR) sensor, a temperature sensor, a humidity sensor, or an illuminance sensor. The configuration of the display 203, audio module 247a and 247b, and camera module 249a and 249b of FIG. 2 may be identical in whole or part to the configuration of the display module 160, the audio module 170, and the camera module 180 of FIG. 1.

Each embodiment herein may be used in combination with any other embodiment herein.

FIG. 4 is an exploded perspective view illustrating an electronic device according to an embodiment of the disclosure;

Referring to FIG. 4, an electronic device 101 may include a first housing 201, a second housing 202, a display 203, and a display support member 213. A portion (e.g., the second display area A2) of the display 203 may be received in the electronic device 101 while being guided by the display support member 213. The configuration of the first housing 201, the second housing 202, and the display 203 of FIG. 4 may be identical in whole or part to the configuration of the first housing 201, the second housing 202, and the display 203 of FIGS. 2 and/or 3.

According to an embodiment, the first housing 201 may include a first plate 211 and a slide cover 212. The first plate 211 and the slide cover 212 may linearly reciprocate in one direction (e.g., the direction of arrow ① in FIG. 2) while being guided by the second housing 202. According to an embodiment, the first plate 211, along with the slide cover 212, may slide with respect to the second housing 202. For example, at least a portion of the display 203 and/or at least a portion of the display support member 213 may be disposed between the first plate 211 and the slide cover 212.

According to an embodiment, the first plate 211 may support at least a portion of the display 203 (e.g., the second display area A2). For example, the first plate 211 may include a curved surface 250. At least a portion of the second display area A2 of the display 203 may be positioned on the curved surface 250. According to an embodiment, the first plate 211 may be interpreted as a display support bar (DSB) and/or a display support plate (DSP).

According to an embodiment, the slide cover 212 may protect the display 203 positioned on the first plate 211. For example, the slide cover 212 may surround at least a portion of the display 203. At least a portion of the display 203 may be positioned between the first plate 211 and the slide cover 212. According to an embodiment, the first plate 211 and the slide cover 212 may be formed of a metal material and/or a non-metal (e.g., polymer) material.

According to an embodiment, the first housing 201 may include a guide rail 215. According to an embodiment, the guide rail 215 may be connected (directly or indirectly) to the first plate 211 and/or the slide cover 212. For example, the guide rail 215, along with the first plate 211 and the slide cover 212, may slide with respect to the second housing 202.

According to an embodiment, the electronic device 101 may include a display supporting member 213. According to an embodiment, the display supporting member 213 may support the display 203. For example, the display supporting member 213 may be connected (directly or indirectly) with the display 203. According to an embodiment, at least a portion of the display 203 and the display supporting member 213 may be positioned between the first plate 211 and the slide cover 212. According to an embodiment, as the first housing 201 slides, the display supporting member 213 may move with respect to the second housing 202. In the closed state (e.g., FIG. 2) of the display supporting member 213, most of the structure may be received in the second housing 202. According to an embodiment, at least a portion of the display supporting member 213 may move corresponding to the curved surface 250 positioned at the edge of the first plate 211.

According to an embodiment, the display supporting member 213 may include a plurality of rods (or rods) 214. For example, the display supporting member 213 may be referred to as a multi-bar structure. The plurality of rods 214 may extend in a straight line and be disposed parallel to the rotational axis R formed by the curved surface 250, and the plurality of rods 214 may be arranged along a direction perpendicular to the rotational axis R (e.g., the direction along which the first housing 201 slides).

According to an embodiment, each rod 214 may move together with another adjacent rod 214 while remaining parallel with the other adjacent rod 214. According to an embodiment, as the first housing 201 slides, the plurality of rods 214 may be arranged to form a curved shape or may be arranged to form a planar shape. For example, as the first housing 201 slides, a portion of the display supporting member 213 facing the curved surface 250 may form a curved surface, and another portion of the display supporting member 213 that does not face the curved surface 250 may form a flat surface. According to an embodiment, the second display area A2 of the display 203 may be mounted or supported on the display supporting member 213, and in the opened state (e.g., FIG. 3), at least a portion of the second display area A2, along with the first display area A1, may be exposed to the outside of the second housing 202. In the state in which the second display area A2 is exposed to the outside of the second housing 202, the display supporting member 213 may substantially form a flat surface, thereby supporting or maintaining the second display area A2 in the flat state. According to an embodiment, the display supporting member 213 may be replaced with a bendable integral supporting member (not shown). According to an embodiment, the display supporting member 213 may be interpreted as a multi-bar or articulated hinge structure.

According to an embodiment, the guide rail 215 may guide the movement of the plurality of rods 214. According to an embodiment, the guide rail 215 may include an upper guide rail adjacent to the 1-2th sidewall (e.g., the 1-2th sidewall 211b in FIG. 3) and a lower guide rail adjacent to the 1-3th sidewall (e.g., the 1-3th sidewall 211c). According to an embodiment, the guide rail 215 may include a groove-shaped rail 215a formed inside the guide rail 215 and a protrusion 215b positioned inside the guide rail. At least a portion of the protrusion 215b may be surrounded by the rail 215a. According to an embodiment, the display supporting member 213 may be positioned between the upper guide rail and the lower guide rail and may move while remaining engaged with the upper and lower guide rails. For example, upper and/or lower portions of the plurality of rods 214 may slide along the rail 215a while fitted into the rail 215a.

According to an embodiment, when the electronic device 101 is opened (e.g., a slide-out operation), the size of the area where the display 203 is exposed to the outside may be increased. For example, the first plate 211, which receives the driving force of the motor structure 260 through the gear structure 270, may be slid out, and the protrusion 215b inside the guide rail 215 may push out the upper and/or lower ends of the plurality of rods 214. Accordingly, the display 203 received between the first plate 211 and the slide cover 212 may be expanded.

According to an embodiment, when the electronic device 101 is closed (e.g., a slide-in operation), the size of the area where the display 203 is exposed to the outside may be reduced. For example, by driving the motor structure 260 (e.g., driving for sliding in the display) and/or by an external force provided by the user, the first plate 211 may be slid in, and the outer portion (e.g., a portion other than the protrusion 215b) of the guide rail 215 may push out the upper and/or lower ends of the plurality of rods 214. Accordingly, the expanded display 203 may be received between the first plate 211 and the slide cover 212.

According to an embodiment, the second housing 202 may include a second plate 221, a cover member 222, and a rear plate 223. According to an embodiment, the second plate 221 may support at least a portion (e.g., the first display area A1) of the display 203. The second plate 221 may be disposed between the display 203 and the circuit board 204. According to an embodiment, the second plate 221 may be referred to as a front structure receiving at least part of the components of the electronic device 101. According to an embodiment, the cover member 222 may receive components (e.g., the battery 289 (e.g., the battery 189 of FIG. 1) and the circuit board 204) of the electronic device 101 and may protect the components of the electronic device 101. According to an embodiment, the cover member 222 may be referred to as a book cover.

According to an embodiment, a plurality of circuit boards may be received in the second housing 202. A processor, memory, and/or interface may be mounted on the circuit board 204 which is the main board. The processor may include one or more of, e.g., a central processing unit, an application processor, a graphic processing device, an image signal processing, a sensor hub processor, or a communication processor. According to an embodiment, the circuit board 204 may include a flexible printed circuit board type radio frequency cable (FRC). For example, the circuit board 204 may be disposed in the cover member 222 and may be electrically connected with an antenna module (e.g., the antenna module 197, including at least one antenna, of FIG. 1) and a communication module (e.g., the communication module 190, including communication circuitry, of FIG. 1).

According to an embodiment, the memory may include, e.g., a volatile or non-volatile memory.

According to an embodiment, the interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to an embodiment, the electronic device 101 may further include a separate sub circuit board 290 spaced apart from the circuit board 204 in the second housing 202. The sub circuit board 290 may be electrically connected (directly or indirectly) with the circuit board 204 through the flexible circuit board 291. The sub circuit board 290 may be electrically connected with electrical components disposed in an end of the electronic device 101, such as the battery 289 or a speaker and/or a sim socket, and may transfer signals and power.

According to an embodiment, the battery 289 may be a device for supplying power to at least one component of the electronic device 101. The battery 189 may include, e.g., a primary cell which is not rechargeable, a secondary cell which is rechargeable, or a fuel cell. At least a portion of the battery 289 may be disposed on substantially the same plane as the circuit board 204. The battery 289 may be integrally or detachably disposed inside the electronic device 101.

According to an embodiment, the battery 289 may be formed as a single embedded battery or may include a plurality of removable batteries (e.g., the first battery 289a and the second battery 289b). According to an embodiment, when the embedded battery is positioned on the first plate 211, the embedded battery may move as the first plate 211 slides. According to an embodiment, when the embedded battery is positioned on the second plate 221, the embedded battery may be fixedly disposed on the second plate 221, regardless of the sliding movement of the first plate 211. As another example, when the first battery 289a of the removable batteries is positioned on the first plate 211, and the second battery 289b of the removable batteries is fixedly positioned on the second plate 221, only the first battery 289a may move as the first plate 211 slides.

According to an embodiment, the rear plate 223 may substantially form at least a portion of the exterior of the second housing 202 or the electronic device 101. For example, the rear plate 223 may be coupled to the outer surface of the cover member 222. According to an embodiment, the rear plate 223 may be integrally formed with the cover member 222. According to an embodiment, the rear plate 223 may provide a decorative effect on the exterior of the electronic device 101. The second plate 221 and the cover member 222 may be formed of at least one of a metal or a polymer, and the rear plate 223 may be formed of at least one of metal, glass, synthetic resin or ceramic. According to an embodiment, the second plate 221, the cover member 222 and/or the rear plate 223 may be formed of a material that transmits light at least partially (e.g., the auxiliary display area). For example, in a state in which a portion of the display 203 (e.g., the second display area A2) is received in the electronic device 101, the electronic device 101 may output visual information using the second display area A2. The auxiliary display area may be a portion of the second plate 221, the cover member 222, and/or the rear plate 223 in which the display 203 received in the second housing 202 is positioned.

The electronic device 101 disclosed in FIGS. 2 to 4 has a rollable or slidable appearance but the scope is not limited thereto. According to an embodiment (not shown), at least a portion of the illustrated electronic device may be rolled up in a scroll shape.

Referring to FIGS. 2 to 4, when viewed from the front of the electronic device 101, the display 203 may expand to the right of the electronic device 101. However, the structure of the electronic device 101 is not limited thereto. For example, according to an embodiment, the display 203 may expand to the left of the electronic device 101. According to another embodiment, the display 203 may expand in the length direction of the electronic device 101.

Figure 5:
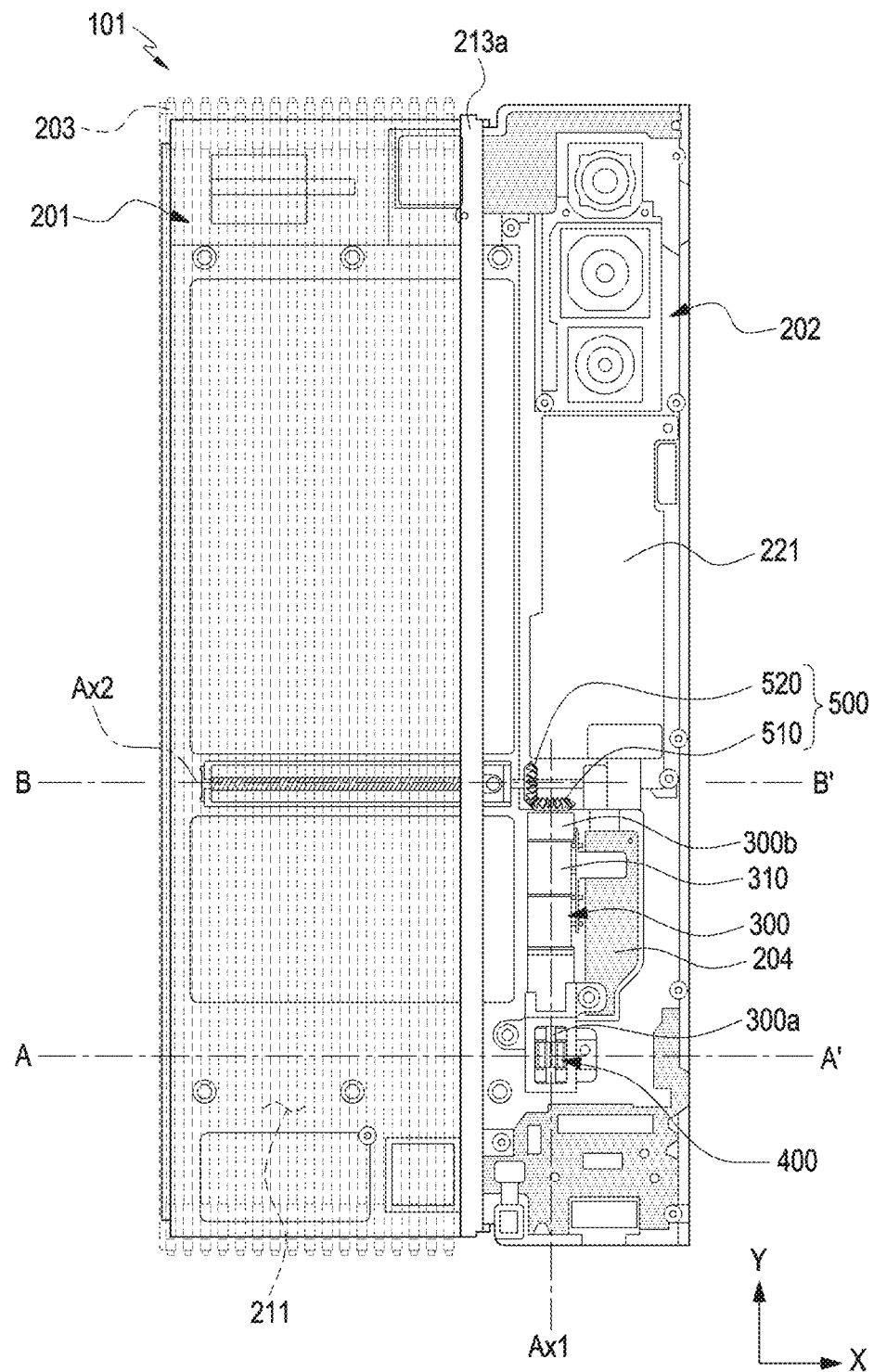
FIG. 5 is a rear view illustrating an electronic device in a closed state, according to an embodiment of the disclosure.
Figure 6:
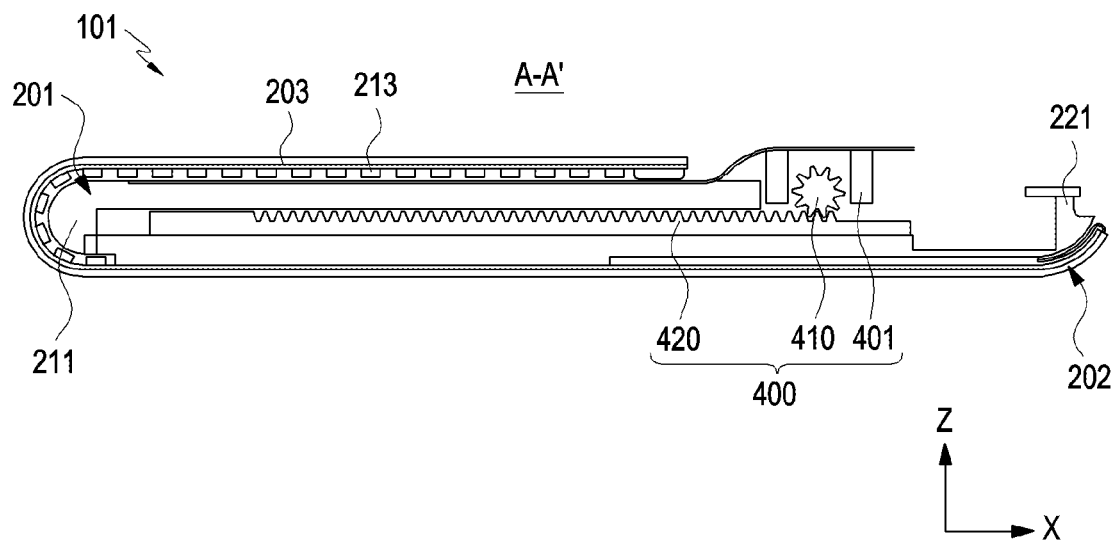
FIG. 6 is a cross-sectional view taken along line A-A' of FIG. 5.
Figure 7:
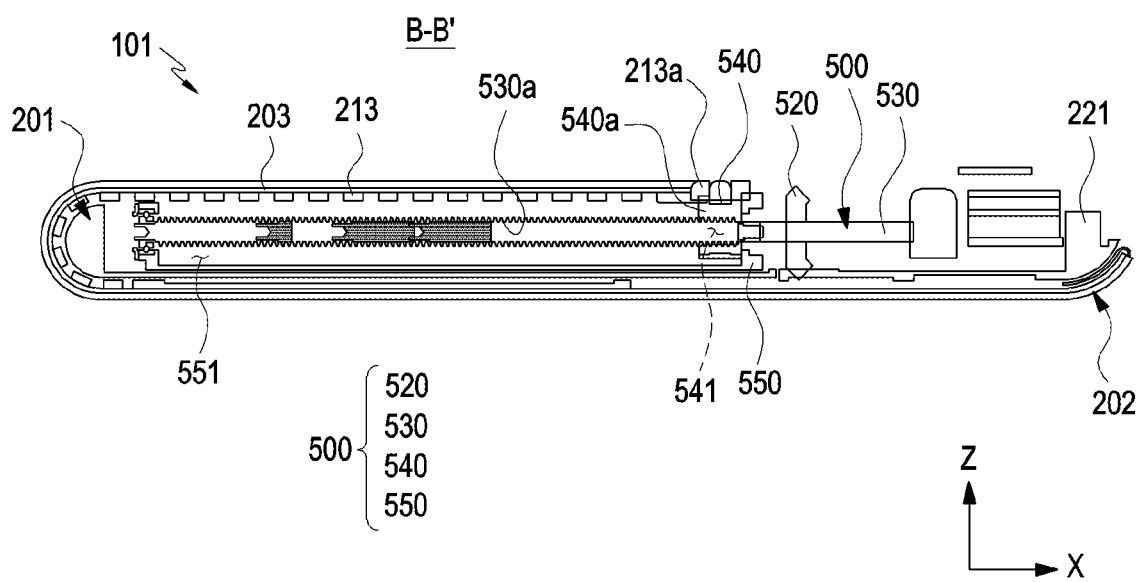
FIG. 7 is a cross-sectional view taken along line B-B' of FIG. 5.
Figure 8:
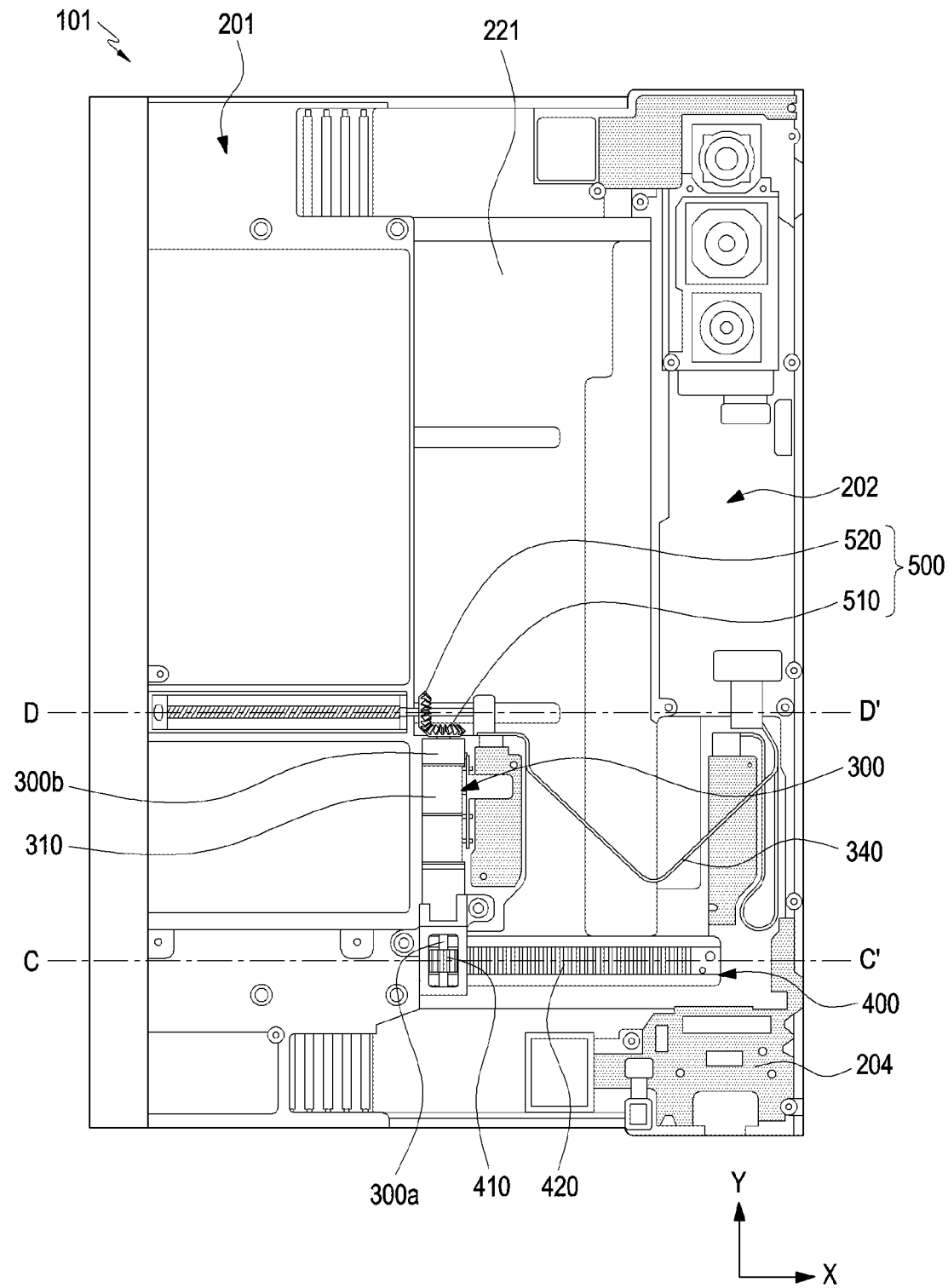
FIG. 8 is a rear view illustrating an electronic device in an opened state, according to an embodiment of the disclosure.
Figure 9:
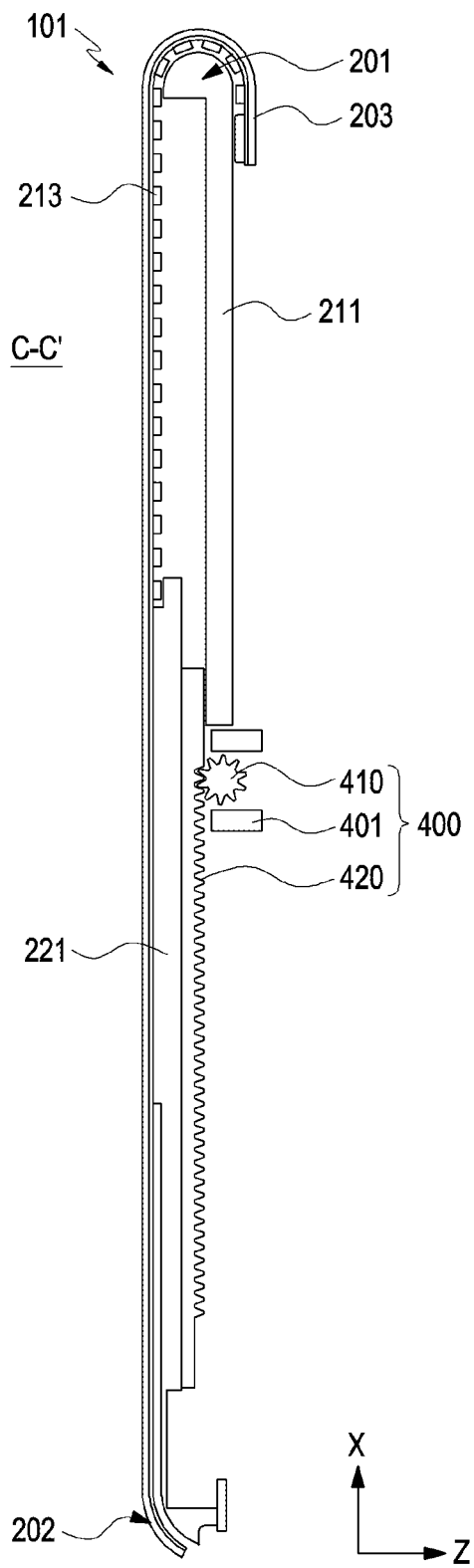
FIG. 9 is a cross-sectional view taken along line C-C' of FIG. 8.
Figure 10:
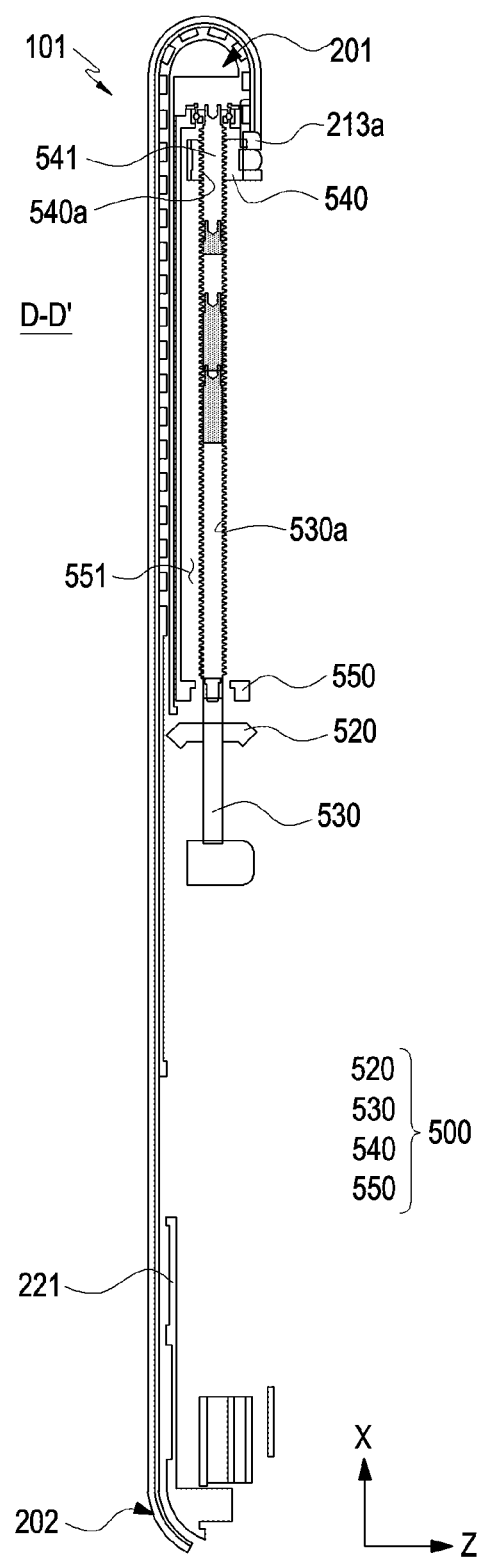
FIG. 10 is a cross-sectional view taken along line D-D' of FIG. 8.
Figure 11:
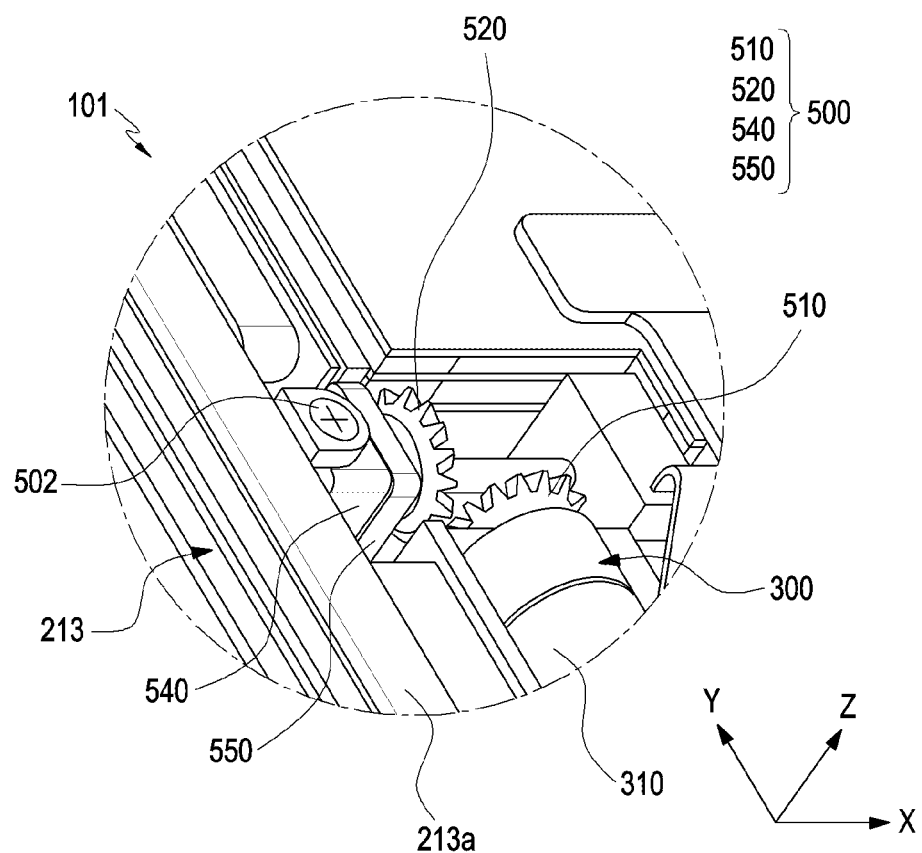
FIG. 11 is a view illustrating connection between a second gear assembly and a display supporting member according to an embodiment of the disclosure.

FIG. 5 is a rear view illustrating an electronic device in a closed state, according to an embodiment of the disclosure. FIG. 6 is a cross-sectional view taken along line A-A' of FIG. 5. FIG. 7 is a cross-sectional view taken along line B-B' of FIG. 5. FIG. 8 is a rear view illustrating an electronic device in an opened state, according to an embodiment of the disclosure. FIG. 9 is a cross-sectional view taken along line C-C' of FIG. 8. FIG. 10 is a cross-sectional view taken along line D-D' of FIG. 8. FIG. 11 is a view illustrating connection between a second gear assembly and a display supporting member according to an embodiment of the disclosure;

Referring to FIGS. 5 and 11, an electronic device 101 may include a first housing 201, a second housing 202, a display support member 213, a motor structure 300, a first gear assembly 400, and a second gear assembly 500. The configuration of the first housing 201, the second housing 202, the display support member 213, and the motor structure 300 of FIGS. 5 to 11 may be identical in whole or part to the configuration of the first housing 201, the second housing 202, the display supporting member 213, and the motor structure 260 of FIG. 4. Each "gear assembly" herein includes at least one gear.

According to an embodiment, the motor structure 300 may generate power (e.g., a driving force) for sliding the electronic device 101 and/or the housing 200. For example, the motor structure 300 may include a motor core 310 capable of converting electrical energy into kinetic energy (e.g., rotational energy). According to an embodiment, the motor structure 300 may be connected (directly or indirectly) to a portion (e.g., the first gear 410) of the first gear assembly 400 and transfer a driving force to the first gear 410. According to an embodiment, the motor structure 300 may be connected (directly or indirectly) to a portion (e.g., the third gear 510) of the second gear assembly 500 and transfer a driving force to the third gear 510. According to an embodiment, the motor structure 300 may be disposed on the first housing 201. According to an embodiment, the motor core 310 may include a plurality of motor cores disposed in series.

According to an embodiment, the motor structure 300 may be controlled by a processor (e.g., the processor 120 of FIG. 1). For example, the processor 120 may include a motor driver driving circuit and provide a pulse width modulation (PWM) signal for controlling the speed of the motor structure 300 and/or the torque of the motor structure 300 to the motor structure 300. According to an embodiment, the motor structure 300 may be electrically coupled to a processor (e.g., the processor 120 of FIG. 1) positioned on the circuit board 204 using a flexible printed circuit board 340. Each "processor" herein includes processing circuitry.

According to an embodiment, the first gear assembly 400 may transfer at least a portion of the driving force generated in the motor structure 300 to the first housing 201 and/or the second housing 202. For example, the first gear assembly 400 may transfer a driving force for a slide-in and/or slide-out motion of the electronic device 101 to the first housing 201 and/or the second housing 202.

According to an embodiment, the first gear assembly 400 may include a plurality of gears (e.g., the first gear 410 and the second gear 420) for transferring at least a portion of the driving force generated by the motor core 310 to the first housing 201.

According to an embodiment, the first gear assembly 400 may include a gear bracket 401 receiving the first gear 410. The gear bracket 401 may surround at least a portion of the first gear 410. According to an embodiment, the gear bracket 401 may be connected (directly or indirectly) to the first housing 201 by using at least one fastening member (e.g., a screw). The gear bracket 401 may be connected to the same housing (e.g., the first housing 201) as that of the motor structure 300.

According to an embodiment, the first gear assembly 400 may include the first gear 410 connected (directly or indirectly) to the motor structure 300. For example, the first gear 410 may be connected to a first end 300a of the motor structure 300.

According to an embodiment, the first gear 410 may be connected (directly or indirectly) to the motor core 310 and be rotated based on the rotation of the motor core 310. According to an embodiment, when the electronic device 101 slides in and/or slides out, the first gear 410 may be rotated along the first rotational axis Ax1. According to an embodiment, the first gear 410 may be referred to as a pinion gear. According to an embodiment, the first gear 410 may be a spur gear.

According to an embodiment, the first gear assembly 400 may include a second gear 420 disposed on the second housing 202. According to an embodiment, the driving force generated by the motor core 310 may be transferred to the second gear 420 through the first gear 410. For example, the first gear 410 may rotate while meshing with the second gear 420. According to an embodiment, the second gear 420 may be a rack gear extending along the slide direction (e.g., the X-axis direction) of the electronic device 101.

According to an embodiment, the second gear 420 may be connected (directly or indirectly) to the housing different from that of the motor structure 300. For example, the motor structure 300 may be connected to a portion (e.g., the first plate 211) of the first housing 201, and the second gear 420 may be connected to a portion (e.g., the second plate 221) of the second housing 202. According to an embodiment, the second gear 420 may move relative to the motor structure 300.

According to an embodiment, the second gear assembly 500 may transfer at least a portion of the driving force generated by the motor structure 300 to the display supporting member 213. For example, the second gear assembly 500 may unroll or roll the display 203 by the driving force generated by the motor structure 300.

According to an embodiment, the second gear assembly 500 may be connected (directly or indirectly) to the display supporting member 213. For example, at least a portion of the second gear assembly 500 may be connected to the end bar 213a of the display supporting member 213. The end bar 213a may be referred to as one bar or plate of the display supporting member 213 supporting the end of the second display area (e.g., the second display area A2 of FIG. 4).

According to an embodiment, the second gear assembly 500 may include the third gear 510 connected (directly or indirectly) to the motor structure 300. For example, the third gear 510 may be connected to the second end 300b of the motor structure 300 and may be rotated based on the rotation of the motor core 310. According to an embodiment, when the slide-out motion and/or the slide-in motion of the electronic device 101 is performed, the third gear 510 may be rotated about substantially the same axis (e.g., the first rotational axis Ax1) as the first gear 410 or a rotational axis substantially parallel to the first rotational axis Ax1. According to an embodiment, the third gear 510 may be a bevel gear.

According to an embodiment, the second gear assembly 500 may include a fourth gear 520 configured to rotate based on the rotation of the third gear 510. For example, the fourth gear 520 may be meshed with the third gear 510, and receive at least a portion of the driving force generated by the motor core 310 through the third gear 510. According to an embodiment, when the electronic device 101 slides in and/or slides out, the fourth gear 520 may be rotated about the second rotational axis Ax2 substantially perpendicular to the first rotational axis Ax1. The second rotational axis Ax2 may be disposed along a slide direction (X-axis direction) of the electronic device 101. According to an embodiment, the fourth gear 520 may be a bevel gear.

According to an embodiment, the second gear assembly 500 may include a shaft structure 530 that is rotatable based on the rotation of the fourth gear 520. For example, the shaft structure 530 may be connected (directly or indirectly) to the fourth gear 520 and may rotate together with the fourth gear 520. According to an embodiment, the shaft structure 530 may extend along the slide direction (X-axis direction) of the electronic device 101.

According to an embodiment, the shaft structure 530 may provide a driving force for the movement of the slide member 540 to the slide member 540. For example, at least a portion of the shaft structure 530 may be surrounded by a slide member 540, and the slide member 540 may move along the shaft structure 530. According to an embodiment, the shaft structure 530 may include a screw surface 530a facing the slide member 540 and transfer at least a portion of the driving force transferred from the motor core 310 to the slide member 540 by using the screw surface 530a.

According to an embodiment, the second gear assembly 500 may include the second gear assembly 500 may include a slide member 540. The slide member 540 may be moved based on the rotation of the shaft structure 530. According to an embodiment, the slide member 540 may surround at least a portion of the shaft structure 530. For example, the slide member 540 may include a through hole 541 for receiving the shaft structure 530. The through hole 541 may be defined by an inner surface 540a of the slide member 540. The inner surface 540a may be engaged with the screw surface 530a of the shaft structure 530.

According to an embodiment, the slide member 540 may be connected (directly or indirectly) to the display supporting member 213. For example, the slide member 540 may slide while being connected to the end bar 213a of the display supporting member 213 by the fastening member 502. As the slide member 540 moves with respect to the fourth gear 520, the end bar 213a may also move with respect to the fourth gear 520.

According to an embodiment, the second gear assembly 500 may include a guide member 550. According to an embodiment, the guide member 550 may guide the movement of the slide member 540. For example, the guide member 550 may include a rail 551 or a recess for receiving at least a portion of the slide member 540. The slide member 540 may move along the rail 551 or the recess. According to an embodiment, the guide member 550 may be disposed on the first housing 201.

According to an embodiment, the second gear assembly 500 may unroll or roll the display 203 by at least a portion of the driving force generated by the motor structure 300. For example, at least a portion of the driving force generated in the motor structure 300 may be transferred to the fourth gear 520 through the third gear 510 connected (directly or indirectly) to the motor structure 300. The shaft structure 530 connected to the fourth gear 520 may rotate together with the fourth gear 520. The slide member 540 may receive at least a portion of the driving force generated by the motor structure 300 by the shaft structure 530. The rotation of the slide member 540 is prevented or reduced by the guide member 550 and/or the display supporting member 213. The slide member 540 may move along the slide direction (X-axis direction) of the electronic device 101.

According to an embodiment, the distance at which the end bar 213a of the display supporting member 213 moves with respect to the second housing 202 may be twice the distance at which the motor structure 300 moves with respect to the second housing 202.

Figure 12:
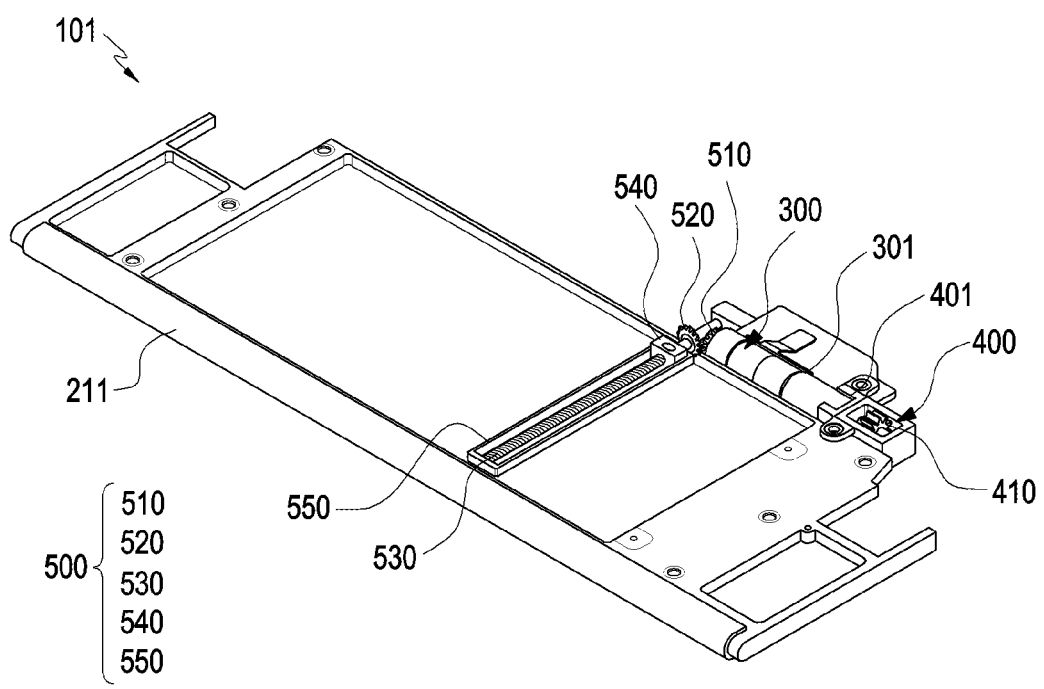
FIG. 12 is a perspective view illustrating a first plate where a motor structure, a first gear assembly, and a second gear assembly are mounted according to an embodiment of the disclosure.
Figure 13:
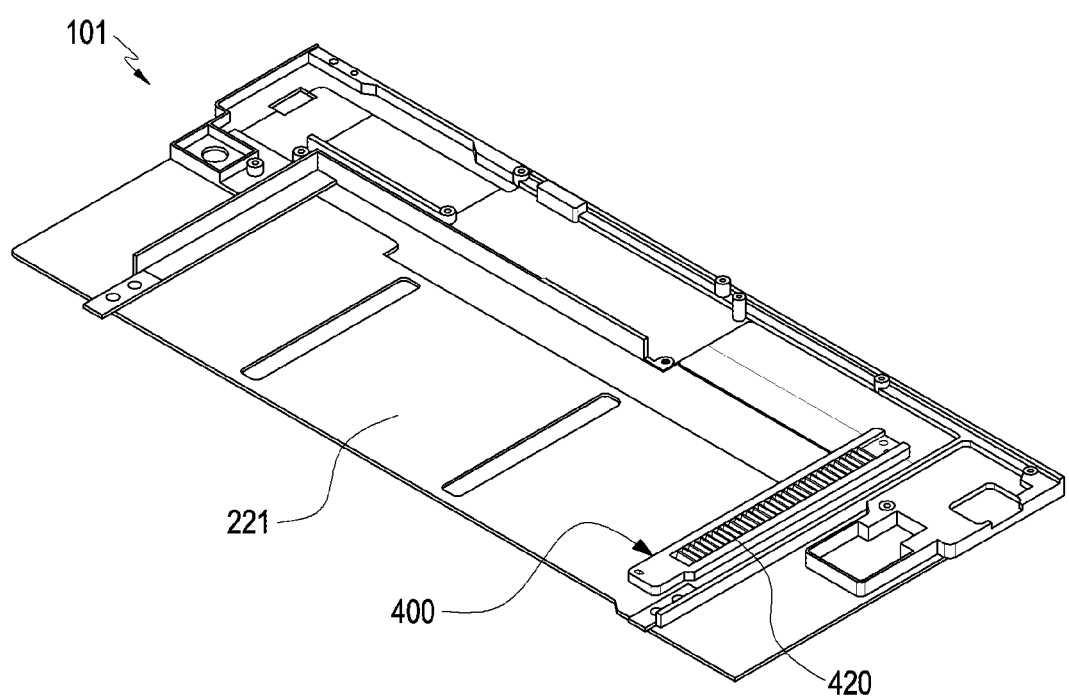
FIG. 13 is a perspective view illustrating a second plate where a first gear is mounted according to an embodiment of the disclosure.

FIG. 12 is a perspective view illustrating a first plate where a motor structure, a first gear assembly, and a second gear assembly are mounted according to an embodiment. FIG. 13 is a perspective view illustrating a second plate where a first gear is mounted according to an embodiment of the disclosure.

Referring to FIGS. 12 and/or 13, the electronic device 101 may include a first plate 211, a second plate 221, a motor structure 300, a first gear assembly 400, and a second gear assembly 500.

The configuration of the first plate 211, the second plate 221, the motor structure 300, the first gear assembly 400, and the second gear assembly 500 of FIGS. 12 and/or 13 may be identical in whole or part to the configuration of the first plate 211, the second plate 221, the motor structure 300, the first gear assembly 400, and the second gear assembly 500 of FIG. 5.

According to an embodiment, the motor structure 300 may be disposed on the first plate 211. According to an embodiment, the motor core 310 of the motor structure 300 may be connected to the first plate 211 by the motor bracket 301. When the electronic device 101 slides, the motor structure 300 may move with respect to the second housing (e.g., the second housing 202 of FIG. 2).

According to an embodiment, a portion (e.g., the gear bracket 401 and the first gear 410) of the first gear assembly 400 may be connected to the first plate 211. For example, the gear bracket 401 and the first gear 410 may slide together with the motor structure 300.

According to an embodiment, the second gear 420 of the first gear assembly 400 may be connected to the second plate 221. According to an embodiment, when the motor core 310 is rotated with the first gear 410 meshing with the second gear 420, the first plate 211 may be moved relative to the second plate 221.

According to an embodiment, a portion (e.g., the third gear 510, the fourth gear 520, the shaft structure 530, and the guide member 550) of the second gear assembly 500 may be connected to the first plate 211. For example, the second gear assembly 500, along with the first gear 410 and the first plate 211, may be moved relative to the second plate 221.

Figure 14:
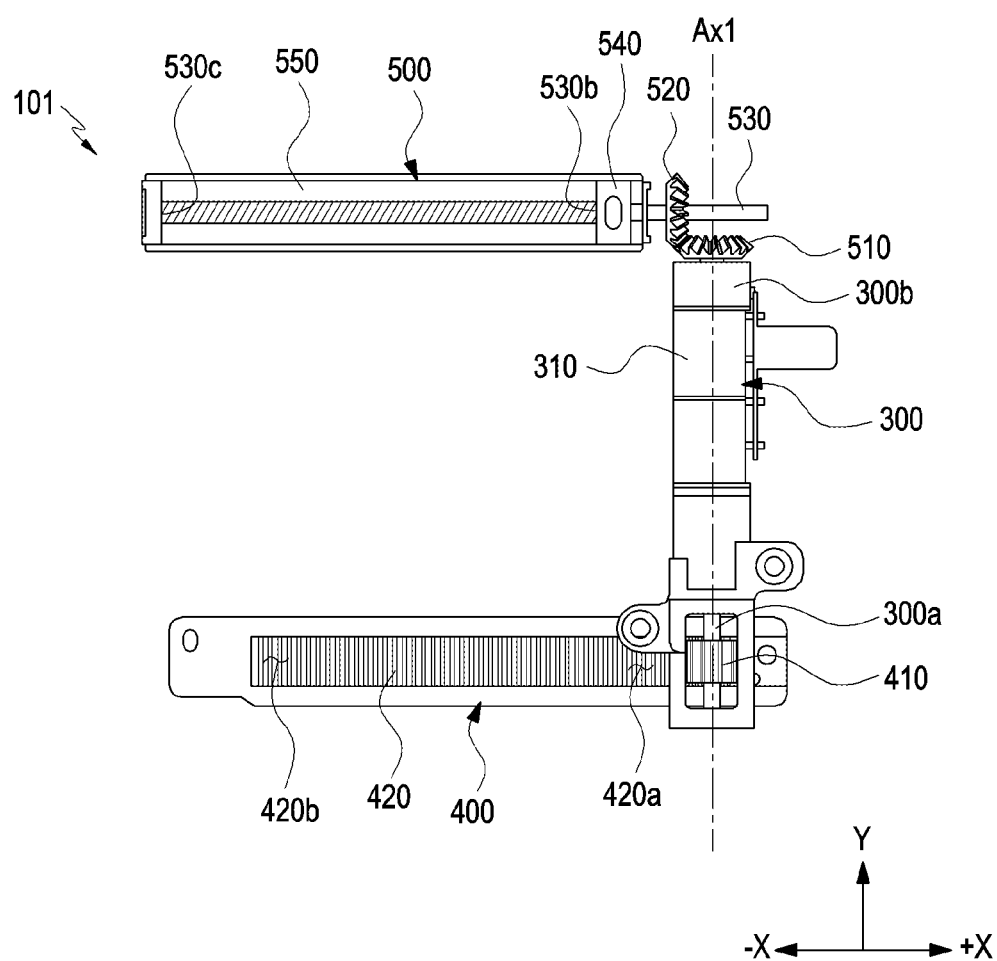
FIG. 14 is a view illustrating positions of a first gear assembly, a second gear assembly, and a motor structure in a closed state of an electronic device according to an embodiment of the disclosure.
Figure 15:
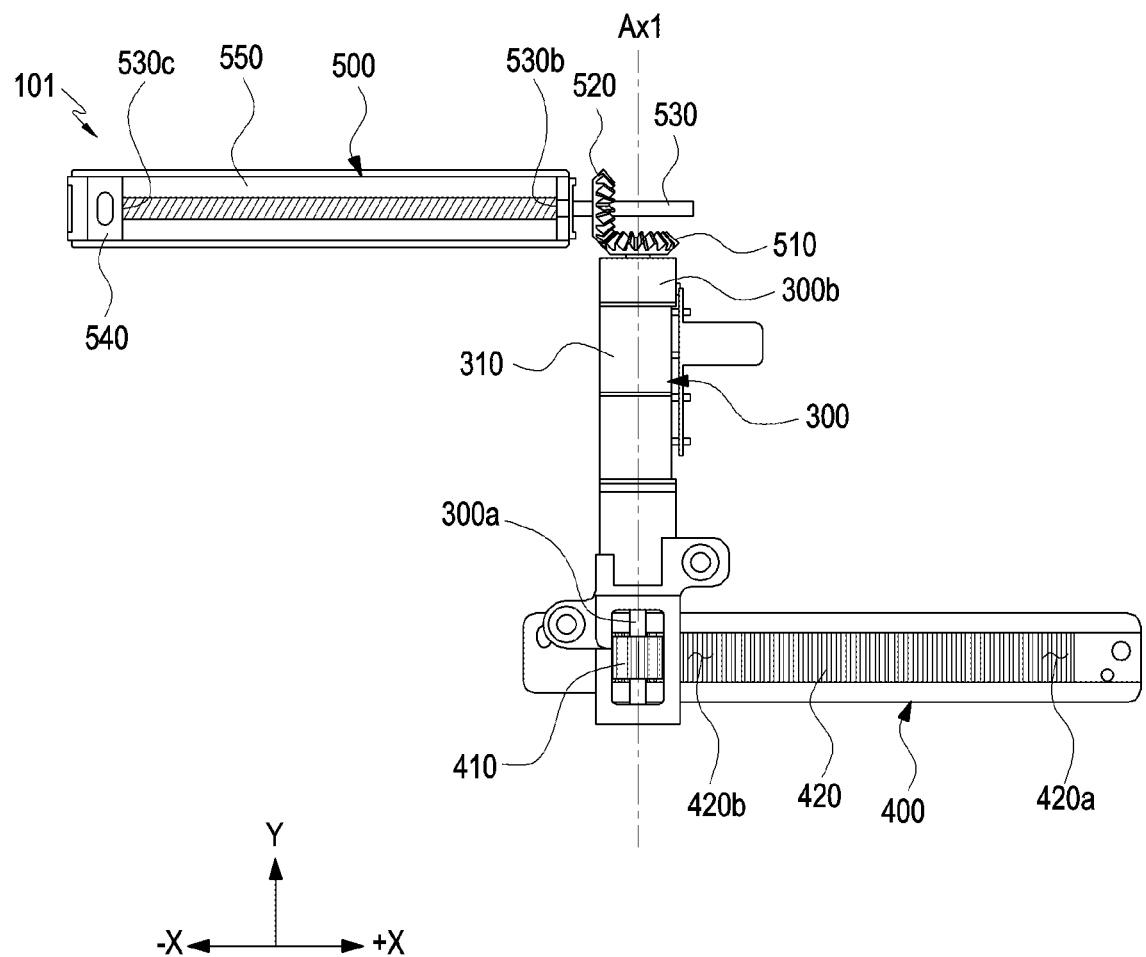
FIG. 15 is a view illustrating positions of a first gear assembly, a second gear assembly, and a motor structure in an opened state of an electronic device according to an embodiment of the disclosure.

FIG. 14 is a view illustrating positions of a first gear assembly, a second gear assembly, and a motor structure in a closed state of an electronic device according to an embodiment of the disclosure. FIG. 15 is a view illustrating positions of a first gear assembly, a second gear assembly, and a motor structure in an opened state of an electronic device according to an embodiment of the disclosure.

Referring to FIGS. 14 and/or 15, the electronic device 101 may include a motor structure 300, a first gear assembly 400, and a second gear assembly 500. The configuration of the motor structure 300, the first gear assembly 400, and the second gear assembly 500 of FIGS. 14 and/or 15 may be identical in whole or part to the configuration of the motor structure 300, the first gear assembly 400, and the second gear assembly 500 of FIG. 8.

According to an embodiment, the motor structure 300 may be disposed between the first gear assembly 400 and the second gear assembly 500. For example, the first end 300a of the motor structure 300 may be connected to at least a portion (e.g., the first gear 410) of the first gear assembly 400, and the second end 300b opposite to the first end 300a may be connected to at least a portion (e.g., the third gear 520) of the second gear assembly 500. According to an embodiment, the first gear assembly 400 may be positioned opposite to the second gear assembly 500 with respect to the motor structure 300.

According to an embodiment, the first gear 410 of the first gear assembly 400 may be rotated about the same rotational axis (e.g., the first rotational axis Ax1) as the third gear 510 of the second gear assembly 500. For example, the first gear 410 and the third gear 510 may be connected to a shaft extending from one motor core 310. As another example, the motor structure 300 may include a plurality of motor cores 310 disposed substantially in parallel. The first gear 410 and the third gear 510 may be connected to a motor shaft extending from the plurality of motor cores 310.

According to an embodiment, the first gear 410 may move with respect to the second gear 420. The second gear 420 may include a first end 420a adjacent (directly or indirectly) the motor structure 300 and a second end 420b opposite to the first end 420a. Referring to FIG. 14, in the closed state of the electronic device 101, the first gear 410 may contact at least a portion of the first end 420a of the second gear 420. Referring to FIG. 15, in the opened state of the electronic device 101, the first gear 410 may contact at least a portion of the second end 420b of the second gear 420.

According to an embodiment, the slide member 540 may be moved with respect to the motor structure 300. The shaft structure 530 may include a third end 530b adjacent (directly or indirectly) the motor structure 300 and a fourth end 530c opposite to the third end 530b. Referring to FIG. 14, in the closed state of the electronic device 101, the slide member 540 may contact at least a portion of the third end 530b of the shaft structure 530. Referring to FIG. 15, in the opened state of the electronic device 101, the slide member 540 may contact at least a portion of the fourth end 530c of the shaft structure 530.

According to an embodiment, when the electronic device 101 is opened, the motor structure 300 may move in the second direction (−X) with respect to the second gear 420, and the slide member 540 may move in the second direction (−X) with respect to the motor structure 300.

According to an embodiment, the distance at which the slide member 540 moves with respect to the second housing (e.g., the second housing 202 of FIG. 2) may be twice the distance at which the motor structure 300 moves with respect to the second housing 202.

Figure 16:
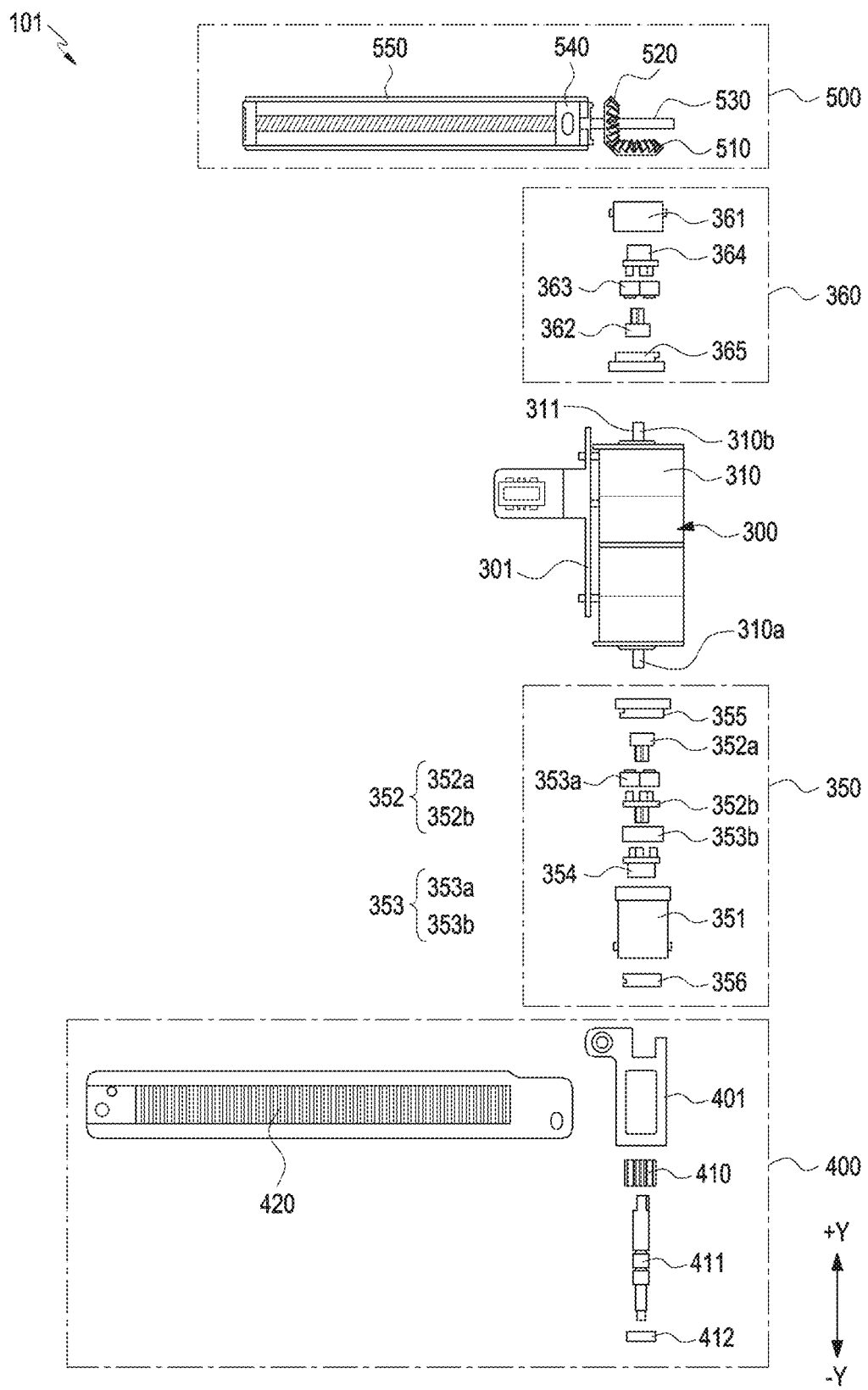
FIG. 16 is an exploded perspective view illustrating a motor structure, a first gear assembly, and a second gear assembly according to an embodiment of the disclosure.

FIG. 16 is an exploded perspective view illustrating a motor structure, a first gear assembly, and a second gear assembly according to an embodiment of the disclosure.

Referring to FIG. 16, the electronic device 101 may include a motor structure 300, a first gear assembly 400, and a second gear assembly 500. The configuration of the motor structure 300, the first gear assembly 400, and the second gear assembly 500 of FIG. 16 may be identical in whole or part to the configuration of the motor structure 300, the first gear assembly 400, and the second gear assembly 500 of FIG. 14.

According to an embodiment, the motor structure 300 may include a motor shaft 311 coupled to a motor core 310. According to an embodiment, the first shaft end 310a of the motor shaft 311 may define at least a portion of the first end 300a of the motor structure 300, and the second shaft end 310b, which is opposite to the first shaft end 310a, may define at least a portion of the second end 300b of the motor structure 300. The first shaft end 310a may be connected to the first gear assembly 400, and the second shaft end 310b may be connected to the second gear assembly 500. According to an embodiment, the motor shaft 311 may be an integral shaft. According to another embodiment, the motor shaft 311 may be a plurality of shafts arranged in substantially the same direction (e.g., the length direction (Y-axis direction) of the electronic device 101).

According to an embodiment, the motor structure 300 may include a first speed change gear (or shift gear) 350. The first speed change gear 350 may change the torque and/or rotation speed of the driving force transferred from the motor structure 300 to the first gear 410. According to an embodiment, the first speed change gear 350 may be denoted as a first end (e.g., the first end 300a of FIG. 14) of the motor structure 300 or may be interpreted as a component positioned or connected to the first end 300a. For example, the first gear assembly 400 may be interpreted as a structure connected to the first end 300a of the motor structure 300. According to an embodiment, the first speed change gear 350 may be connected to the first shaft end 310a of the motor shaft 311 connected to the motor core 310. According to an embodiment, the first speed change gear 350 may be disposed between the motor core 310 and the first gear assembly 400.

According to an embodiment, the first speed change gear 350 may include a first ring gear 351, at least one first sun gear 352, at least one first planetary gear 353 and a carrier 354 connected with at least a portion of the first planetary gear 353 and/or at least one first bearing structure 355 and 356 for guiding rotation of the first ring gear 351. According to an embodiment, the first speed change gear 350 may be referred to as a two-stage gear. For example, the first speed change gear 350 may include a plurality of sun gears 352a and 352b and a plurality of planetary gears 353a and 353b. The first gear ratio GR1 of the first speed change gear 350 may meet Equation 1 below.

$$GR1 = \left(1 + \frac{R1}{S11}\right) \times \left(1 + \frac{R1}{S12}\right) \quad \text{[Equation 1]}$$

In Equation 1, R1 may denote the number of gear teeth of the first ring gear 351, S11 may denote the number of gear teeth of the 1-1th sun gear 352a, and S12 may denote the number of gear teeth of the 1-2th sun gear 352b.

According to an embodiment, the first ring gear 351 may transfer at least a portion of the driving force generated by the motor structure 300 to the first gear 410. For example, the first ring gear 351 may be connected to the first gear shaft 411 and may rotate together with the first gear shaft 411. According to an embodiment, the first gear shaft 411 may be connected to the first gear 410 and may rotate together with the first gear 410. The first gear shaft 411 may be supported by at least one bearing structure 356 and 412. The frictional force generated by the rotation of the first gear shaft 411 may be reduced by the bearing structures 356 and 412. According to an embodiment, the first ring gear 351 may be rotated by the driving force transferred through the first planetary gear 353. According to an embodiment, the first ring gear 351 may be disposed between the motor core 310 and the first gear 410.

According to an embodiment, the first ring gear 351 may surround at least a portion of the first sun gear 352 and/or the first planetary gear 353. According to an embodiment, the first ring gear 351 may include gear teeth that mesh with at least one first planetary gear 353.

According to an embodiment, the at least one first sun gear 352 may transfer the driving force generated in the motor structure 300 to the first planetary gear 353. According to an embodiment, the at least one first sun gear 352 may include a 1-1th sun gear 352a connected to a first shaft end 310a of the motor shaft 311 and a 1-2th sun gear 352b spaced apart from the 1-1th sun gear 352a and rotated based on the driving force transferred from the first planetary gear 353. For example, the first sun gear 352 may be connected to the motor shaft 311 rotated based on the rotation of the motor core 310. According to an embodiment, the first sun gear 352 may rotate while meshing with the first planetary gear 353.

According to an embodiment, the at least one first planetary gear 353 may be disposed between the first ring gear 351 and the first sun gear 352. The first planetary gear 353 may mesh with the first ring gear 351 and the first sun gear 352. According to an embodiment, at least a portion of the driving force generated in the motor structure 300 may be transferred through at least one first sun gear 352, at least one first planetary gear 353, and first ring gear 351 to the first gear 410 and/or the first gear shaft 411.

According to an embodiment, the at least one first planetary gear 353 may include a plurality of gears connected through the carrier 354. For example, the plurality of gears may rotate about the center of the first sun gear 352 (e.g., revolution) while rotating (e.g., rotation) about their respective central axes.

According to an embodiment, the first speed change gear 350 may include at least one first bearing structure 355 and 356 for guiding the rotation of the first ring gear 351. The first ring gear 351 may rotate with respect to the motor structure 300 and the gear bracket 401 while being surrounded by the first bearing structures 355 and 356. The first bearing structures 355 and 356 may include a 1-1th bearing 355 connected to the motor core 310 and a 1-2th bearing 356 connected to the gear bracket 401. According to an embodiment, the motor structure 300 may include a second speed change gear 360. The second speed change gear 360 may change the torque and/or rotation speed of the driving force transferred from the motor structure 300 to the third gear 510. According to an embodiment, the second speed change gear 360 may be referred to as a second end of the motor structure 300 (e.g., the second end 300b of FIG. 14). For example, the second gear assembly 500 may be interpreted as a structure positioned or connected to the second end 300b of the motor structure 300. According to an embodiment, the second speed change gear 360 may be connected to the second shaft end 310b of the motor shaft 311 connected to the motor core 310. According to an embodiment, the second speed change gear 360 may be disposed between the motor shaft 311 and the second gear assembly 500. According to an embodiment, the second speed change gear 360 may include a second ring gear 361, a second sun gear 362, a second planetary gear 363, a carrier 364 connected to the second planetary gear 363, and a second bearing structure 365 for guiding the rotation of the second ring gear 361. According to an embodiment, the second gear ratio GR2 of the second speed change gear 360 may meet Equation 2 below.

$$GR2 = \left(1 + \frac{R2}{S2}\right)$$ [Equation 2]

In Equation 2, R1 may denote the number of gear teeth of the second ring gear 361, and S2 may denote the number of gear teeth of the second sun gear 362.

According to an embodiment, the second ring gear 361 may transfer at least a portion of the driving force generated by the motor structure 300 to the third gear 510. For example, the second ring gear 361 may be connected to the third gear 510 and may rotate together with the third gear 510. According to an embodiment, the second ring gear 361 may be rotated by the driving force transferred through the second planetary gear 363. According to an embodiment, the second ring gear 361 may be disposed between the motor core 310 and the third gear 510.

According to an embodiment, the second ring gear 361 may surround at least a portion of the second sun gear 362 and/or the second planetary gear 363. According to an embodiment, the second ring gear 361 may include gear teeth meshing with the second planetary gear 363.

According to an embodiment, the second sun gear 362 may be connected to the second end 300b of the motor structure 300. For example, the second sun gear 362 may be connected to the second shaft end 310b of the motor shaft 311 rotated based on the rotation of the motor core 310. According to an embodiment, the second sun gear 362 may rotate while meshing with the second planetary gear 363.

According to an embodiment, the second planetary gear 363 may be disposed between the second sun gear 362 and the second ring gear 361. For example, the second planetary gear 363 may mesh with the second sun gear 362 and the second ring gear 361. According to an embodiment, at least a portion of the driving force generated in the motor structure 300 may be transmitted through the second sun gear 362, the second planetary gear 363, and the second ring gear 361 to the third gear 510.

According to an embodiment, the second planetary gear 363 may include a plurality of gears connected through the carrier 364. For example, the plurality of gears may rotate about the center of the second sun gear 362 (e.g., revolution) while rotating (e.g., rotation) about their respective central axes.

According to an embodiment, the second speed change gear 360 may include a second bearing structure 365 for guiding the rotation of the second ring gear 361. The second ring gear 361 may rotate with respect to the motor structure 300 while being connected to the third gear 510.

According to an embodiment, the first speed change gear 350 and/or the second speed change gear 360 may adjust the rotation speed of the motor structure 300 and/or the torque generated in the motor structure 300 so that the moving speed of the first gear 410 relative to the second gear 420 is substantially equal to the moving speed of the slide member 540 relative to the shaft structure 530. For example, the moving speed of the first gear 410 in the first direction (+X direction) or the second direction (−X direction) may be substantially equal to the moving speed of the slide member 540 in the first direction (+X direction) or the second direction (−X direction).

According to an embodiment, even when the gear size (e.g., the number of gear teeth) of the first gear 410 and the gear size of the third gear 510 are different, the first speed change gear 350 and/or the second speed change gear 360 may make the moving speed of the first gear 410 relative to the second gear 420 substantially equal to the moving speed of the slide member 540 relative to the shaft structure 530. For example, the first gear ratio GR1 of the first speed change gear 350 may be larger than the second gear ratio GR2 of the second speed change gear 360. According to an embodiment, the size of the second gear ratio GR2 may be smaller than the size of the first gear ratio GR1. For example, the reduced rotation speed and/or increased torque in the first speed change gear 350 may be larger than the reduced rotation speed and/or increased torque in the second speed change gear 360.

Figure 17:
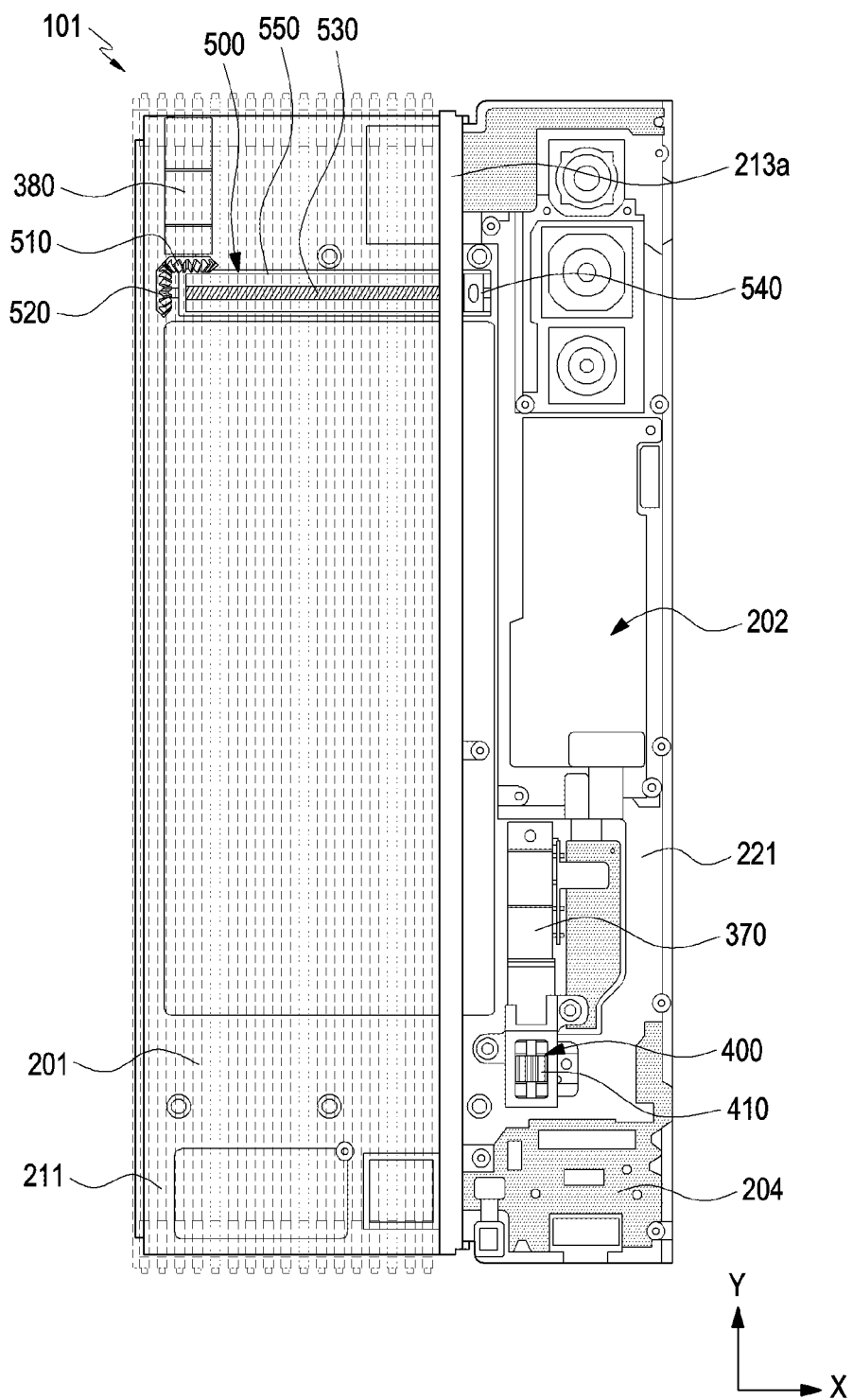
FIG. 17 is a rear view illustrating an electronic device in a closed state, according to an embodiment of the disclosure.
Figure 18:
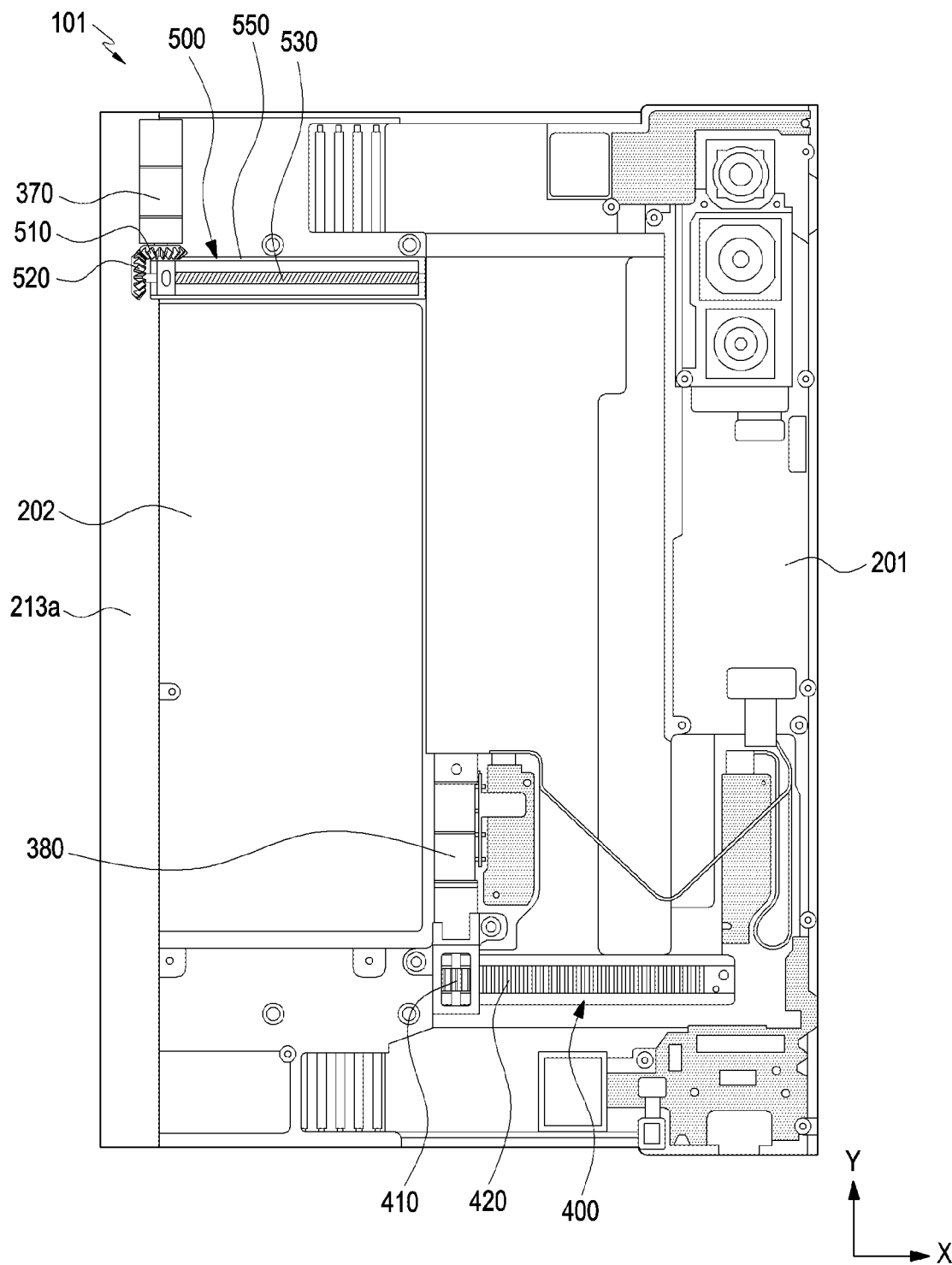
FIG. 18 is a rear view illustrating an electronic device in an opened state, according to an embodiment of the disclosure.

FIG. 17 is a rear view illustrating an electronic device in a closed state, according to an embodiment of the disclosure. FIG. 18 is a rear view illustrating an electronic device in an opened state, according to an embodiment of the disclosure.

Referring to FIGS. 17 and 18, an electronic device 101 may include a first housing 201, a second housing 202, an end bar 213a, a configuration of a motor structure 300, a configuration of a first gear assembly 400 (e.g., the first gear 410 and/or the second gear 420), and a configuration of a second gear assembly 500 (e.g., the third gear 510, the fourth gear 520, the shaft structure 530, the slide member 540 and/or the guide member 550). The configuration of the first housing 201, the second housing 202, the motor structure 300, the first gear assembly 400, and the second gear assembly 500 of FIGS. 17 and/or 18 may be identical in whole or part to the configuration of the first housing 201, the second housing 202, the motor structure 300, the first gear assembly 400, and the second gear assembly 500 of FIGS. 5 and 8.

According to an embodiment, the motor structure 300 may include a plurality of motor cores 370 and 380 spaced apart from each other. For example, the motor structure 300 may include a first motor core 370 connected to the first gear 410 of the first gear assembly 400 and a second motor core 380 connected to the third gear 510 of the second gear assembly 500. The first motor core 370 may transfer the driving force to the first gear assembly 400. The second motor core 380 may transfer the driving force to the second gear assembly 500. According to an embodiment, the second motor core 380 may be disposed substantially parallel to the first motor core 370. For example, the first gear 410 and the third gear 510 may rotate about their respective rotational axes.

According to an embodiment, the first motor core 370 and the second motor core 380 may be connected to the first housing 201 (e.g., the first plate 211). For example, the first motor core 370 and the second motor core 380 may move with respect to the second housing 202 (e.g., the second plate 221).

According to an embodiment, the first motor core 370 and the second motor core 380 each may be electrically connected to a processor (e.g., the processor 120 of FIG. 1). For example, the processor 120 may provide a pulse width control signal to the first motor core 370 and/or the second motor core 380. According to an embodiment, the first rotation speed of the first motor core 370 and the second rotation speed of the second motor core 380 may be designed so that the slide speed of the first housing 201 (e.g., the first plate 211) is substantially equal to the slide speed of the display supporting member (e.g., the end bar 213a of the display supporting member 213 of FIG. 4).

An electronic device (e.g., a portable terminal) includes a display with a flat surface or both a flat and curved surface. An electronic device including a display may have a limitation in realizing a screen larger than the size of the electronic device due to the fixed display structure. Therefore, rollable or slidable electronic devices including a flexible display are being researched.

The rolling or slide of the electronic device may be performed by sliding the housing using the driving force generated by a motor of the electronic device. Further, the rolling or unrolling of the flexible display may be performed by sliding the housing. However, when the driving force generated in the motor structure is transferred to the housing but is not transferred directly to the display, a peel-off of the display may occur due to the repulsive force of the display.

According to an embodiment of the disclosure, there may be provided gear assemblies capable of transferring the driving force generated in the motor structure to the housing and the display, respectively.

The disclosure is not limited to the foregoing embodiments but various modifications or changes may rather be made thereto without departing from the spirit and scope of the disclosure.

According to an embodiment of the disclosure, the electronic device may transfer the driving force of the motor structure to the housing by the first gear assembly and may transfer the driving force of the motor structure to the display by the second gear assembly. As the driving force generated in the motor structure is transferred to the housing and the display, the peel-off of the display may be reduced.

According to an embodiment of the disclosure, an electronic device (e.g., the electronic device 101 of FIG. 2) may comprise a housing (e.g., the housing 200 of FIG. 2) including a first housing (e.g., the first housing 201 of FIG. 2) and a second housing (e.g., the second housing 202 of FIG. 2) configured to receive at least a portion of the first housing and move relative to the first housing, a display (e.g., the display 203 of FIG. 3) configured to be rolled or unrolled based on a slide of the housing, a display support member (e.g., the display supporting member 213 of FIG. 4) supporting at least a portion of the display, a motor structure (e.g., the motor structure 300 of FIG. 5) including a motor core (e.g., the motor core 310 of FIG. 5) configured to generate a driving force for the slide of the housing and disposed in the housing, a first gear assembly (e.g., the first gear assembly 400 of FIG. 8) connected to the first housing and a first end (e.g., the first end 300a of FIG. 5) of the motor structure and configured to transfer at least a portion of the driving force generated by the motor core to the first housing, and a second gear assembly (e.g., the second gear assembly 500 of FIG. 8) connected to the display supporting member and a second end (e.g., the second end 300b of FIG. 5) of the motor structure, which is opposite to the first end, and configured to transfer at least a portion of the driving force to the display supporting member.

According to an embodiment, the first gear assembly may include a first gear (e.g., the first gear 410 of FIG. 8) connected to the first end and a second gear (e.g., the second gear 420 of FIG. 8) connected to the second housing and configured to mesh with the first gear.

According to an embodiment, the second gear assembly may include a third gear (e.g., the third gear 510 of FIG. 11) connected to the second end, a fourth gear (e.g., the fourth gear 520 of FIG. 11) configured to mesh with the third gear, a shaft structure (e.g., the shaft structure 530 of FIG. 7) configured to rotate along with the fourth gear, and a slide member (e.g., the slide member 540 of FIG. 7) configured to slide based on rotation of the fourth gear.

According to an embodiment, the display supporting member may include a multi-bar structure including a plurality of bars. The slide member may be connected to an end bar (e.g., the end bar 213a of FIG. 11) of the multi-bar structure.

According to an embodiment, the second gear assembly may include a rail (e.g., the rail 551 of FIG. 10) for guiding a slide of the slide member (comprising a slide) and a guide member (e.g., the guide member 550 of FIG. 10) connected to the first housing.

According to an embodiment, at least a portion of the first gear assembly and at least a portion of the second gear assembly may be configured to rotate about a same rotational axis. The motor core may be disposed between (directly or indirectly) at least a portion of the first gear assembly and at least a portion of the second gear assembly.

According to an embodiment, the motor core may include a first motor core (e.g., the first motor core 370 of FIG. 17) for transferring the driving force to the first gear assembly and a second motor core (e.g., the second motor core 380 of FIG. 17) for transferring the driving force to the second gear assembly.

According to an embodiment, the motor structure may include a first speed change gear (e.g., the first speed change gear 350 of FIG. 16) connected to the motor core and the first gear assembly and a second speed change gear (e.g., the second speed change gear 360 of FIG. 16) connected to the motor core and the second gear assembly.

According to an embodiment, the first speed change gear may include a first ring gear (e.g., the first ring gear 351 of FIG. 16) connected to the first gear assembly, at least one first sun gear (e.g., the second sun gear 352 of FIG. 16) connected to the motor structure, and a first planetary gear (e.g., the first planetary gear 363 of FIG. 16) disposed between (directly or indirectly) the first ring gear and the at least one first sun gear, and the second speed change gear may include a second ring gear (e.g., the second ring gear 361 of FIG. 16) connected to the second gear assembly, a second sun gear (e.g., the second sun gear 362 of FIG. 16) connected to the motor structure, and a second planetary gear (e.g., the second planetary gear 363 of FIG. 16) disposed between (directly or indirectly) the second sun gear and the second ring gear.

According to an embodiment, the first speed change gear may have a first gear ratio, and the second speed change gear may have a second gear ratio smaller than the first gear ratio.

According to an embodiment, the display may include a first display area (e.g., the first display area A1 of FIG. 4) visually exposed to an outside of the electronic device and a second display area (e.g., the second display area A2 of FIG. 4) extending from the first display area and configured to be rolled or unrolled based on the slide of the first housing.

According to an embodiment, the first housing may include a first plate (e.g., the first plate 211 of FIG. 4) for guiding a movement of the second display area, and the second housing may include a second plate (e.g., the second plate 221 of FIG. 4) supporting the first display area.

According to an embodiment, the motor structure may include a motor bracket (e.g., the motor bracket 301 of FIG. 12) connecting (directly or indirectly) the motor core and the first plate. The first gear assembly may include a second gear (e.g., the second gear 420 of FIG. 13) connected to the second plate, and the second gear assembly may include a guide member 550 connected to the first plate.

According to an embodiment, a distance at which an end bar (e.g., the end bar 213a of FIG. 10) of the multi-bar structure moves with respect to the second housing may be twice the distance at which the motor structure moves with respect to the second housing.

According to an embodiment, the motor structure may include a motor shaft (e.g., the motor shaft 311 of FIG. 16) connected to the motor core and including a first shaft end and a second shaft end opposite to the first shaft end. A first gear (e.g., the first gear 410 of FIG. 16) of the first gear assembly may be connected to the first shaft end of the motor shaft, and a third gear (e.g., the third gear 510 of FIG. 16) of the second gear assembly may be connected to the second shaft end of the motor shaft.

According to an embodiment, an electronic device (e.g., the electronic device 101 of FIG. 2) may comprise a housing (e.g., the housing 200 of FIG. 3) including a first housing (e.g., the first housing 201 of FIG. 3) and a second housing (e.g., the second housing 202 of FIG. 3) configured to receive at least a portion of the first housing and move relative to the first housing, a display (e.g., the display 203 of FIG. 3) configured to be rolled or unrolled based on a slide of the housing, a display supporting member (e.g., the display supporting member 213 of FIG. 4) supporting at least a portion of the display, a motor structure (e.g., the motor structure 300 of FIG. 13) including a motor core (e.g., the motor core 310 of FIG. 5) configured to generate a driving force for the slide of the housing, a motor shaft (e.g., the motor shaft 311 of FIG. 13) connected (directly or indirectly) to the motor core, a first speed change gear (e.g., the first speed change gear 350 of FIG. 13) connected (directly or indirectly) to a first shaft end (e.g., the first shaft end 310a of FIG. 13) of the motor shaft, and a second speed change gear (e.g., the second speed change gear 360 of FIG. 13) connected (directly or indirectly) to a second shaft end (e.g., the second shaft end 310b of FIG. 13) of the motor shaft, opposite to the first shaft end, a first gear assembly (e.g., the first gear assembly 400 of FIG. 13) having at least a portion connected (directly or indirectly) to the second housing and configured to transfer at least a portion of the driving force transferred from the first speed change gear to the first housing, and a second gear assembly (e.g., the second gear assembly 500 of FIG. 13) having at least a portion connected (directly or indirectly) to the display supporting member and configured to transfer at least a portion of the driving force transferred from the second speed change gear to the display supporting member.

According to an embodiment, the first gear assembly may include a first gear (e.g., the first gear 410 of FIG. 16) connected (directly or indirectly) to the first speed change gear and a second gear (e.g., the second gear 420 of FIG. 16) connected (directly or indirectly) to the second housing and configured to mesh with the first gear, and the second gear assembly may include a third gear (e.g., the third gear 510 of FIG. 16) connected (directly or indirectly) to the second speed change gear, a fourth gear (e.g., the fourth gear 520 of FIG. 16) configured to mesh with the third gear, a shaft structure (e.g., the shaft structure 530 of FIG. 16) configured to rotate along with the fourth gear, and a slide member (e.g., the slide member 540 of FIG. 16) configured to slide along the shaft structure based on rotation of the fourth gear.

According to an embodiment, the first gear and the third gear may be configured to rotate about a first rotational axis (e.g., the first rotational axis Ax1 of FIG. 15). At least a portion of the motor core may be disposed between (directly or indirectly) the first gear and the third gear.

According to an embodiment, the first speed change gear may have a first gear ratio, and the second speed change gear may have a second gear ratio smaller than the first gear ratio.

According to an embodiment, the display may include a first display area (e.g., the first display area A1 of FIG. 3) visually exposed to an outside of the electronic device and a second display area (e.g., the second display area A2 of FIG. 3) extending from the first display area and configured to be rolled or unrolled based on the slide of the first housing. The first housing may include a first plate (e.g., the first plate 211 of FIG. 4) for guiding a movement of the second display area, and the second housing may include a second plate (e.g., the second plate 221 of FIG. 4) supporting the first display area.

It is apparent to one of ordinary skill in the art that an electronic device including a gear assembly according to the disclosure are not limited to the above-described embodiments and those shown in the drawings, and various changes, modifications, or alterations may be made thereto without departing from the scope.

What is claimed is:

1. An electronic device comprising:
a housing including a first housing and a second housing configured to receive at least a portion of the first housing, the first housing is configured to move relative to the second housing;
a display configured to be rolled and/or unrolled based on a slide movement of at least part of the housing;
a display support member supporting at least a portion of the display and configured to move along with the display;
a motor structure, including a motor core and a motor shaft driven directly by the motor core, configured to generate a driving force for the slide movement of the first housing and at least partially disposed in the housing, wherein the motor shaft comprises a first shaft end and a second shaft end opposite to the first shaft end;
a first gear assembly connected to the first housing and engaged with the first shaft end of the motor shaft and configured to transfer at least a portion of the driving force generated by the motor core to the first housing; and
a second gear assembly connected to the display support member and engaged with the second shaft end of the motor shaft, and configured to transfer at least a portion of the driving force to the display support member,
wherein the second gear assembly is configured to displace the display support member relative to the second housing, and wherein the first gear assembly is configured to displace the first housing relative to the second housing.

2. The electronic device of claim 1, wherein the first gear assembly includes a first gear connected to the first shaft end and a second gear connected to the second housing and configured to mesh with the first gear.

3. The electronic device of claim 1, wherein the second gear assembly includes a third gear connected to the second shaft end, a fourth gear configured to mesh with the third gear, a shaft structure configured to rotate along with the fourth gear, and a slide member, comprising a slide, configured to slide based on rotation of the fourth gear.

4. The electronic device of claim 3, wherein the display support member includes a multi-bar structure including a plurality of bars, and
wherein the slide member is connected to an end bar of the multi-bar structure.

5. The electronic device of claim 3, wherein the second gear assembly includes a rail configured for guiding a slide of the slide member and a guide member connected to the first housing.

6. The electronic device of claim 1, wherein at least a portion of the first gear assembly and at least a portion of the second gear assembly are configured to rotate about a same rotational axis, and
wherein the motor core is disposed between at least a portion of the first gear assembly and at least a portion of the second gear assembly.

7. The electronic device of claim 1, wherein the motor structure further includes:
a first speed change gear connected to the motor core and the first gear assembly, and
a second speed change gear connected to the motor core and the second gear assembly.

8. The electronic device of claim 7, wherein the first speed change gear has a first gear ratio, and the second speed change gear has a second gear ratio smaller than the first gear ratio.

9. The electronic device of claim 7, wherein the first speed change gear includes a first ring gear connected to the first gear assembly, at least one first sun gear connected to the motor structure, and a first planetary gear disposed between the first ring gear and the at least one first sun gear, and
wherein the second speed change gear includes a second ring gear connected to the second gear assembly, a second sun gear connected to the motor structure, and a second planetary gear disposed between the second sun gear and the second ring gear.

10. The electronic device of claim 1, wherein the display includes a first display area visually exposed to an outside of the electronic device and a second display area extending from the first display area and configured to be rolled or unrolled based on the slide movement of the first housing.

11. The electronic device of claim 10, wherein the first housing includes a first plate for guiding a movement of the second display area, and the second housing includes a second plate supporting the first display area.

12. The electronic device of claim 11, wherein the motor structure further includes a motor bracket connecting the motor core and the first plate,
wherein the first gear assembly includes a second gear connected to the second plate, and
wherein the second gear assembly includes a guide member connected to the first plate.

13. The electronic device of claim 1, wherein the display support member includes an end bar connected to the second gear assembly, and
wherein a distance at which the end bar moves with respect to the second housing is at least twice a distance at which the motor structure moves with respect to the second housing.

14. The electronic device of claim 1,
wherein a first gear of the first gear assembly is connected to the first shaft end of the motor shaft, and a third gear of the second gear assembly is connected to the second shaft end of the motor shaft.

15. An electronic device comprising:
a housing including a first housing and a second housing, the second housing configured to receive at least a portion of the first housing and move relative to the first housing;
a display configured to be rolled and/or unrolled based on a slide movement of at least part of the housing;
a display support member supporting at least a portion of the display and configured to move along with the display;
a motor structure including a motor core configured to generate a driving force for the slide movement of the housing, a motor shaft directly connected to the motor core, a first speed change gear connected to a first shaft end of the motor shaft, and a second speed change gear connected to a second shaft end of the motor shaft, opposite to the first shaft end;
a first gear assembly comprising at least a portion connected to the second housing and configured to transfer at least a portion of the driving force transferred from the first speed change gear to the first housing, wherein the first gear assembly is configured to displace the first housing relative to the second housing; and
a second gear assembly comprising at least a portion connected to the display support member and configured to transfer at least a portion of the driving force transferred from the second speed change gear to the display support member, wherein the second gear assembly is configured to displace the display support member relative to the second housing.

16. The electronic device of claim 15, wherein the first gear assembly includes a first gear connected to the first speed change gear and a second gear connected to the second housing and configured to mesh with the first gear, and the second gear assembly includes a third gear connected to the second speed change gear, a fourth gear configured to mesh with the third gear, a shaft structure configured to rotate along with the fourth gear, and a slide member, comprising a slide, configured to slide along the shaft structure based on rotation of the fourth gear.

17. The electronic device of claim 16, wherein the first gear and the third gear are configured to rotate about a first rotational axis, and wherein at least a portion of the motor core is disposed between the first gear and the third gear.

18. The electronic device of claim 15, wherein the first speed change gear has a first gear ratio, and the second speed change gear has a second gear ratio smaller than the first gear ratio.

19. The electronic device of claim 15, wherein the display includes a first display area visually exposed to an outside of the electronic device and a second display area extending from the first display area and configured to be rolled or unrolled based on the slide movement of the first housing, and wherein the first housing includes a first plate for guiding a movement of the second display area, and the second housing includes a second plate supporting the first display area.

* * * * *